(12) United States Patent
Shih et al.

(10) Patent No.: US 12,347,730 B2
(45) Date of Patent: Jul. 1, 2025

(54) METHOD OF MANUFACTURING SEMICONDUCTOR STRUCTURE HAVING VIAS WITH DIFFERENT DIMENSIONS

(71) Applicant: NANYA TECHNOLOGY CORPORATION, New Taipei (TW)

(72) Inventors: Shing-Yih Shih, New Taipei (TW); Chih-Ching Lin, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 652 days.

(21) Appl. No.: 17/742,959

(22) Filed: May 12, 2022

(65) Prior Publication Data

US 2023/0369210 A1     Nov. 16, 2023

(51) Int. Cl.
*H01L 21/768* (2006.01)
*H01L 23/48* (2006.01)

(52) U.S. Cl.
CPC ...... *H01L 21/76898* (2013.01); *H01L 23/481* (2013.01)

(58) Field of Classification Search
CPC .................. H01L 21/76898; H01L 23/481
See application file for complete search history.

(56) References Cited

U.S. PATENT DOCUMENTS

| 7,531,903 | B2 | 5/2009 | Kao |
| 2015/0357183 | A1 | 12/2015 | Ren et al. |
| 2016/0379963 | A1* | 12/2016 | Tsai .................. H01L 21/76877 257/774 |
| 2019/0123092 | A1 | 4/2019 | Lin et al. |

(Continued)

FOREIGN PATENT DOCUMENTS

| TW | 202209448 A | 3/2022 |
| TW | 202213512 A | 4/2022 |

OTHER PUBLICATIONS

Taiwanese Office Action dated Dec. 19, 2022 in application No. 111124844, the search report attached to the Office Action; pp. 1-4.

(Continued)

*Primary Examiner* — Daniel P Shook
(74) *Attorney, Agent, or Firm* — MUNCY, GEISSLER, OLDS & LOWE, P.C.

(57) ABSTRACT

The present application provides a method of manufacturing a semiconductor structure having vias with different dimensions and a manufacturing method of the semiconductor structure. The method includes: providing a first wafer including a first substrate, a first dielectric layer over the first substrate, and a first conductive pad surrounded by the first dielectric layer; providing a second wafer including a second dielectric layer, a second substrate over the second dielectric layer, and a second conductive pad surrounded by the second dielectric layer; forming a passivation over the second substrate; forming a first conductive via extending from the first conductive pad through the second wafer and the passivation, and having a first width surrounded by the second wafer; and forming a second conductive via extending from the second conductive pad through the passivation and the second substrate and partially through the second dielectric layer, and having a second width surrounded by the second wafer.

15 Claims, 26 Drawing Sheets

(56) References Cited

U.S. PATENT DOCUMENTS

2020/0075550 A1  3/2020  Ye
2021/0043545 A1  2/2021  Huang et al.
2021/0202395 A1  7/2021  Lu
2022/0077068 A1  3/2022  Shih

OTHER PUBLICATIONS

Taiwanese Office Action dated Aug. 4, 2023 in application No. 111124843; pp. 1-6.
Office Action dated Jan. 6, 2025 of U.S. Appl. No. 17/742,544 and the cited references of this Office Action; pp. 1-37.
Office Action dated Mar. 20, 2025 of U.S. Appl. No. 17/742,544 and the cited references of this Office Action; pp. 1-36.

* cited by examiner

S200

```
┌─────────────────────────────────────────┐
│ Providing a first wafer including a first│
│ substrate, a first dielectric layer over the first│ S201
│ substrate, and a first conductive pad   │
│ surrounded by the first dielectric layer│
└─────────────────────────────────────────┘
                    ↓
┌─────────────────────────────────────────┐
│ Providing a second wafer including a second│
│ substrate, a second dielectric layer over the│ S202
│ second substrate, and a second conductive│
│ pad surrounded by the second dielectric layer│
└─────────────────────────────────────────┘
                    ↓
┌─────────────────────────────────────────┐
│ Bonding the first dielectric layer to the second│ S203
│ dielectric layer                        │
└─────────────────────────────────────────┘
                    ↓
┌─────────────────────────────────────────┐
│ Disposing a passivation over the second wafer│ S204
└─────────────────────────────────────────┘
                    ↓
┌─────────────────────────────────────────┐
│ Forming a patterned photoresist layer over the│
│ passivation, wherein the patterned photoresist│ S205
│ layer includes a first through hole and a first│
│ indentation                             │
└─────────────────────────────────────────┘
                    ↓
                  S206

| Removing a first portion of the passivation exposed through the first through hole to form a first opening, and a second portion of the passivation under the first indentation to form a first recess | S206 |

| Removing a third portion of the second substrate exposed through the first opening to form a second recess | S207 |

| Removing a fourth portion of the passivation under the first recess to form a second opening | S208 |

| Removing a fifth portion of the second substrate under the second recess to form a third opening, and a sixth portion of the second substrate exposed through the second opening to form a fourth opening | S209 |

METHOD OF MANUFACTURING SEMICONDUCTOR STRUCTURE HAVING VIAS WITH DIFFERENT DIMENSIONS

TECHNICAL FIELD

The present disclosure relates to a method of manufacturing a semiconductor structure. Particularly, the present disclosure relates to a method of manufacturing a semiconductor structure having vias with different dimensions.

DISCUSSION OF THE BACKGROUND

Semiconductor devices are used in a variety of electronic applications, such as personal computers, cellular telephones, digital cameras, and other electronic equipment. The fabrication of semiconductor devices involves sequentially depositing various material layers over a semiconductor wafer, and patterning the material layers using lithography and etching processes to form microelectronic components, including transistors, diodes, resistors and/or capacitors, on or in the semiconductor wafer.

The semiconductor industry continues to improve the integration density of the microelectronic components by continual reduction of minimum feature size, which allows more components to be integrated into a given area. Smaller package structures with smaller footprints are developed to package the semiconductor devices, in order to facilitate formation and integration of components of different sizes. However, such formation and integration may increase complexity of the manufacturing process. It is therefore desirable to develop improvements that address the aforementioned challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a first wafer including a first substrate, a first dielectric layer over the first substrate, and a first conductive pad surrounded by the first dielectric layer; a second wafer including a second dielectric layer, a second substrate over the second dielectric layer, and a second conductive pad surrounded by the second dielectric layer; a passivation disposed over the second substrate; a first conductive via extending from the first conductive pad through the second wafer and the passivation, and having a first width surrounded by the second wafer; and a second conductive via extending from the second conductive pad through the passivation and the second substrate and partially through the second dielectric layer, and having a second width surrounded by the second wafer, wherein the second width is substantially less than the first width.

In some embodiments, the second conductive via has a third width surrounded by the passivation and disposed above the second width.

In some embodiments, the third width is substantially equal to the first width.

In some embodiments, the third width is substantially greater than the second width.

In some embodiments, the second conductive via has a first portion in the second width, a second portion in the third width, and a tapered portion tapered from the second portion to the first portion, wherein the tapered portion is surrounded by the passivation.

In some embodiments, the tapered portion is disposed between and coupled with the first portion and the second portion.

In some embodiments, a thickness of the first wafer is substantially greater than a thickness of the second wafer.

In some embodiments, the semiconductor structure further comprises a bonding dielectric disposed between the first dielectric layer and the second dielectric layer to bond the first dielectric layer to the second dielectric layer.

In some embodiments, the first conductive via is at least partially surrounded by the bonding dielectric.

In some embodiments, the semiconductor structure further comprises a dielectric liner between the first conductive via and the second wafer, and between the second conductive via and the second wafer.

In some embodiments, the dielectric liner is disposed between the first conductive via and the passivation, and between the second conductive via and the passivation.

In some embodiments, the dielectric liner is disposed over the passivation.

Another aspect of the present disclosure provides a semiconductor structure. The semiconductor structure includes a first wafer; a second wafer disposed over the first wafer; a passivation disposed over the second wafer; a first conductive via extending through the second wafer and the passivation and partially through the first wafer, and having a first width surrounded by the second wafer and the passivation; and a second conductive via extending through the passivation and partially through the second wafer, and having a second width surrounded by the second wafer and a third width surrounded by the passivation, wherein the first width is substantially equal to the third width and is substantially greater than the second width.

In some embodiments, the first conductive via has a consistent width, equal to the first width, along a first height of the first conductive via.

In some embodiments, a first height of the first conductive via is substantially greater than a second height of the second conductive via.

In some embodiments, a thickness of the first wafer is substantially greater than a thickness of the second wafer.

In some embodiments, the first conductive via is in contact with a first conductive pad within the first wafer.

In some embodiments, the second conductive via is in contact with a second conductive pad within the second wafer.

In some embodiments, each of the first conductive via and the second conductive via is entirely surrounded by a dielectric liner.

In some embodiments, a first top surface of the first conductive via and a second top surface of the second conductive via are exposed through the dielectric liner.

Another aspect of the present disclosure provides a method of manufacturing a semiconductor structure. The method includes steps of providing a first wafer including a first substrate, a first dielectric layer over the first substrate, and a first conductive pad surrounded by the first dielectric layer; providing a second wafer including a second substrate, a second dielectric layer over the second substrate, and a second conductive pad surrounded by the second dielectric layer; bonding the first dielectric layer to the second dielectric layer; disposing a passivation over the second wafer; forming a patterned photoresist layer over the passivation, wherein the patterned photoresist layer includes a first through hole and a first indentation; removing a first portion of the passivation exposed through the first through hole to form a first opening, and a second portion of the passivation under the first indentation to form a first recess; removing a third portion of the second substrate exposed through the first opening to form a second recess; removing a fourth portion of the passivation under the first recess to form a second opening; removing a fifth portion of the second substrate under the second recess to form a third opening, and a sixth portion of the second substrate exposed through the second opening to form a fourth opening; removing a seventh portion of the second dielectric layer exposed through the third opening to at least partially expose the second conductive pad, and an eighth portion of the second dielectric layer and a ninth portion of the first dielectric layer exposed through the fourth opening to at least partially expose the first conductive pad, thereby forming a first trench extending through the second wafer and the passivation and partially through the first dielectric layer, and thereby forming a second trench extending through the passivation and the second substrate and partially through the second dielectric layer; removing the patterned photoresist layer; disposing a dielectric liner over the passivation and conformal to the first trench and the second trench; and forming a first conductive via within the first trench and a second conductive via within the second trench.

In some embodiments, the first through hole has a stepped profile, wherein a step portion protrudes inwardly toward the first through hole.

In some embodiments, the first indentation has a first width, and the first through hole has a second width and a third width above the second width substantially greater than the second width.

In some embodiments, the first width is substantially greater than the second width and is substantially equal to the third width.

In some embodiments, the method further comprises, prior to the formation of the patterned photoresist layer: disposing a photoresist layer over the passivation; disposing a mask over the photoresist layer; providing a predetermined electromagnetic radiation over the mask; and irradiating the mask with the predetermined electromagnetic radiation.

In some embodiments, the mask includes a second through hole vertically aligned with and corresponding to the first through hole, and a second indentation vertically aligned with and corresponding to the first indentation.

In some embodiments, the second through hole has a central region and a peripheral region surrounding the central region.

In some embodiments, the central region has a first transmission rate equal to an amount of the predetermined electromagnetic radiation allowed to pass through the central region, the peripheral region has a second transmission rate equal to an amount of the predetermined electromagnetic radiation allowed to pass through the peripheral region, and the second indentation has a third transmission rate equal to an amount of the predetermined electromagnetic radiation allowed to pass through the second indentation.

In some embodiments, the first transmission rate is substantially different from the second transmission rate.

In some embodiments, the first transmission rate is substantially different from the third transmission rate.

In some embodiments, the first transmission rate is substantially greater than the second transmission rate.

In some embodiments, the first transmission rate is substantially greater than the third transmission rate.

In some embodiments, the first transmission rate is about 100%, the second transmission rate is about 6%, and the third transmission rate is substantially less than 6%.

In some embodiments, the predetermined electromagnetic radiation is ultraviolet (UV).

In some embodiments, the method further comprises grinding the second substrate to reduce a thickness of the second substrate after the bonding of the first dielectric layer to the second dielectric layer.

In conclusion, because a mask having different transmission rates in different regions is used during a lithography process, a semiconductor structure having at least two vias of different sizes can be formed. Since at least two vias of different sizes can be formed by one mask, manufacturing cost and materials can be reduced or minimized.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIGS. 2A to 2C are flow diagrams illustrating a method of manufacturing a semiconductor structure in accordance with some embodiments of the present disclosure.

DETAILED DESCRIPTION

Figure 1:
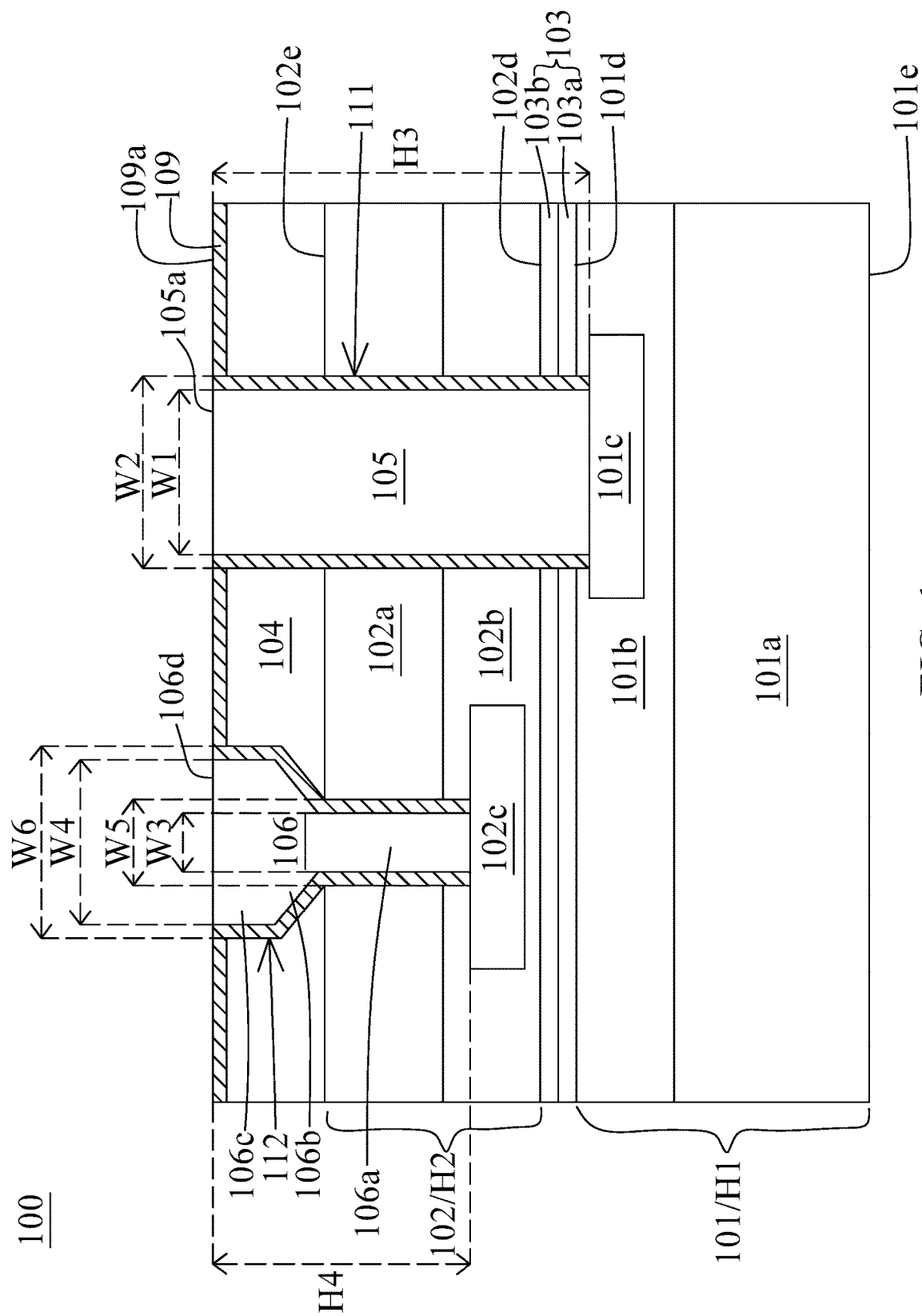
FIG. 1 is a cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a semiconductor structure 100 in accordance with some embodiments of the present disclosure. In some embodiments, the semiconductor structure 100 is a part of a die, a package or a device. In some embodiments, the semiconductor structure 100 is a die, a package or a device. In some embodiments, the semiconductor structure 100 includes a first wafer 101, a second wafer 102, a passivation 104, a first conductive via 105 and a second conductive via 106.

In some embodiments, the first wafer 101 is a workpiece that includes various features formed in or over the first wafer 101. In some embodiments, the first wafer 101 is in various stages of fabrication and is processed using various processes. In some embodiments, the first wafer 101 includes a variety of electrical circuits suitable for a particular application. In some embodiments, FIG. 1 illustrates a part of the first wafer 101. In some embodiments, a top surface of the first wafer 101 has a circular shape or any other suitable shape.

In some embodiments, the first wafer 101 includes a first substrate 101a, a first dielectric layer 101b and a first conductive pad 101c formed in the first dielectric layer 101b. In some embodiments, the first substrate 101a is a part of the first wafer 101. In some embodiments, the first substrate 101a is a semiconductive layer. In some embodiments, the first substrate 101a includes semiconductive material such as silicon, germanium, gallium, arsenic, or a combination thereof. In some embodiments, the first substrate 101a is a silicon substrate.

In some embodiments, electrical devices or components (e.g., various N-type metal-oxide semiconductor (NMOS) and/or P-type metal-oxide semiconductor (PMOS) devices, capacitors, resistors, diodes, photodiodes, fuses, and/or the like) are subsequently formed in or over the first substrate 101a and configured to electrically connect to an external circuitry.

In some embodiments, the first dielectric layer 101b is disposed over the first substrate 101a. In some embodiments, the first dielectric layer 101b includes dielectric material such as oxide, nitride, silicon dioxide, silicon nitride, silicon oxynitride, silicon carbide, polymer or the like. In some embodiments, the first dielectric layer 101b includes several dielectric layers stacked over each other. In some embodiments, each of the dielectric layers includes materials that are same as or different from materials in others of the dielectric layers.

In some embodiments, the first wafer 101 is defined with a first surface 101d and a second surface 10l opposite to the first surface 101d. In some embodiments, the first surface 101d is a front side of the first wafer 101, and the second surface 10l is a back side of the first wafer 101. In some embodiments, various features are formed in or over the first surface 101d of the first wafer 101.

In some embodiments, the first conductive pad 101c is disposed within the first dielectric layer 101b. In some embodiments, the first conductive pad 101c is surrounded by the first dielectric layer 101b. In some embodiments, the first conductive pad 101c is disposed adjacent to the first surface 101d of the first wafer 101 and at least partially exposed through the first dielectric layer 101b.

In some embodiments, the first conductive pad 101c extends laterally in the first dielectric layer 101b. In some embodiments, the first conductive pad 101c is configured to electrically connect to a die, a package or a circuitry external to the semiconductor structure 100. In some embodiments, the first conductive pad 101c includes conductive material such as gold, silver, copper, nickel, tungsten, aluminum, tin, alloys thereof or the like. In some embodiments, a top surface of the first conductive pad 101c has a circular or polygonal shape.

In some embodiments, the second wafer 102 is disposed over the first wafer 101. In some embodiments, the second wafer 102 has a configuration similar to that of the first wafer 101. In some embodiments, a thickness or height H1 of the first wafer 101 is substantially greater than a thickness or height H2 of the second wafer 102.

In some embodiments, the second wafer 102 includes a second substrate 102a, a second dielectric layer 102b and a second conductive pad 102c formed in the second dielectric layer 102b. In some embodiments, the second substrate 102a is a part of the second wafer 102. In some embodiments, the second substrate 102a has a configuration similar to that of the first substrate 101a. In some embodiments, a thickness of the first substrate 101a is substantially greater than a thickness of the second substrate 102a. In some embodiments, the thickness of the second substrate 102a is in a range of about 20 μm to about 50 μm. In some embodiments, the thickness of the second substrate 102a is about 30 μm.

In some embodiments, the second substrate 102a is disposed over the second dielectric layer 102b. In some embodiments, the second dielectric layer 102b has a configuration similar to that of the first dielectric layer 101b. In some embodiments, the second dielectric layer 102b is disposed over the first dielectric layer 101b. In some embodiments, the second dielectric layer 102b includes a material that is same as or different from materials in the first dielectric layer 101b. In some embodiments, a thickness of the second dielectric layer 102b is substantially equal to, greater than or less than a thickness of the first dielectric layer 101b.

In some embodiments, the second wafer 102 includes a third surface 102d and a fourth surface 102e opposite to the third surface 102d. In some embodiments, the third surface 102d is a front side of the second wafer 102, and the fourth surface 102e is a back side of the second wafer 102. In some embodiments, various features are formed in or over the third surface 102d of the second wafer 102. In some embodiments, the first surface 101d is proximal to the third surface 102d and distal to the fourth surface 102e.

In some embodiments, the second conductive pad 102c is disposed within the second dielectric layer 102b. In some embodiments, the second conductive pad 102c is surrounded by the second dielectric layer 102b. In some embodiments, the second conductive pad 102c is disposed adjacent to the third surface 102d of the second wafer 102 and at least partially exposed through the second dielectric layer 102b.

In some embodiments, the second conductive pad 102c extends laterally in the second dielectric layer 102b. In some embodiments, the second conductive pad 102c has a configuration similar to that of the first conductive pad 101c. In some embodiments, the second conductive pad 102c includes a material that is same as or different from materials in the first conductive pad 101c. In some embodiments, the second conductive pad 102c includes conductive material such as gold, silver, copper, nickel, tungsten, aluminum, tin, alloys thereof or the like. In some embodiments, a top surface of the second conductive pad 102c has a circular or polygonal shape.

In some embodiments, the second wafer 102 is bonded over the first wafer 101 by a bonding dielectric 103. In some embodiments, the bonding dielectric 103 is disposed between the first dielectric layer 101b and the second dielectric layer 102b to bond the first dielectric layer 101b to the second dielectric layer 102b. In some embodiments, the bonding dielectric 103 is disposed between the first surface 101d and the third surface 102d. In some embodiments, the bonding dielectric 103 includes polymer, benzocyclobutene (BCB), polybenzoxazole (PBO), polyimide (PI) or the like. In some embodiments, the bonding dielectric 103 includes oxide, nitride or the like. In some embodiments, an interface within the bonding dielectric 103 is absent.

In some embodiments, the bonding dielectric 103 includes several bonding dielectric layers. In some embodiments, the bonding dielectric 103 includes a first bonding dielectric layer 103a and a second bonding dielectric layer 103b. In some embodiments, the second bonding dielectric layer 103b is disposed over the first bonding dielectric layer 103a. In some embodiments, the second bonding dielectric layer 103b includes a material that is same as or different from materials in the first bonding dielectric layer 103a.

In some embodiments, a thickness of the first bonding dielectric layer 103a is substantially less than 10 μm. In some embodiments, the thickness of the first bonding dielectric layer 103a is substantially less than 5 μm. In some embodiments, a thickness of the second bonding dielectric layer 103b is substantially less than 10 μm. In some embodiments, the thickness of the second bonding dielectric layer 103b is substantially less than 5 μm. In some embodiments, an interface is present within the bonding dielectric 103 and between the first bonding dielectric layer 103a and the second bonding dielectric layer 103b.

In some embodiments, the passivation 104 is disposed over the second wafer 102. In some embodiments, the passivation 104 is disposed over the second substrate 102a. In some embodiments, the passivation 104 is disposed over the fourth surface 102e of the second wafer 102. In some embodiments, the passivation 104 includes dielectric materials, such as spin-on glass (SOG), silicon oxide, silicon oxynitride, silicon nitride or the like. In some embodiments, the passivation 104 includes polymer, BCB, PBO, PI or the like.

In some embodiments, the first conductive via 105 extends from and is electrically connected to the first conductive pad 101c. In some embodiments, the first conductive via 105 is at least partially surrounded by the bonding dielectric 103, the passivation 104 and the second wafer 102. In some embodiments, the first conductive via 105 extends through the bonding dielectric 103, the passivation 104, the second dielectric layer 102b and the second substrate 102a. In some embodiments, the first conductive via 105 extends at least partially through the first wafer 101. In some embodiments, the first conductive via 105 extends at least partially through the first dielectric layer 101b.

In some embodiments, the first conductive via 105 is coupled to the first conductive pad 101c. In some embodiments, the first conductive via 105 is in contact with the first conductive pad 101c within the first wafer 101. In some embodiments, the first conductive via 105 is substantially orthogonal to the first conductive pad 101c. In some embodiments, the first conductive via 105 is a through substrate via (TSV). In some embodiments, the first conductive via 105 includes conductive material such as gold, silver, copper, nickel, tungsten, aluminum, tin, alloys thereof or the like. In some embodiments, a top surface of the first conductive via 105 has a circular or polygonal shape. In some embodiments, the first conductive via 105 has a cylindrical shape. In some embodiments, the first conductive via 105 has a first width W1 at a first section surrounded by the second wafer 102 and the passivation 104. In some embodiments, the first conductive via 105 has a consistent width, equal to the first width W1, along a first height H3 of the first conductive via 105.

In some embodiments, the second conductive via 106 extends from and is electrically connected to the second conductive pad 102c. In some embodiments, the second conductive via 106 is at least partially surrounded by the second wafer 102 and the passivation 104. In some embodiments, the second conductive via 106 extends through the passivation 104 and the second substrate 102a and partially through the second dielectric layer 102b.

In some embodiments, the second conductive via 106 is coupled to the second conductive pad 102c. In some embodiments, the second conductive via 106 is in contact with the second conductive pad 102c within the second wafer 102. In some embodiments, an interface between the first conductive via 105 and the first conductive pad 101c is substantially larger than an interface between the second conductive via 106 and the second conductive pad 102c. In some embodiments, the second conductive via 106 is substantially orthogonal to the second conductive pad 102c. In some embodiments, the second conductive via 106 is a through substrate via (TSV). In some embodiments, the second conductive via 106 includes conductive material such as gold, silver, copper, nickel, tungsten, aluminum, tin, alloys thereof or the like. In some embodiments, a top surface of the second conductive via 106 has a circular or polygonal shape. In some embodiments, the second conductive via 106 has a cylindrical shape.

In some embodiments, the second conductive via 106 has a first portion 106a having a second width W3, a second portion 106c having a third width W4, and a tapered portion 106b tapered from the second portion 106c to the first portion 106a. In some embodiments, the tapered portion 106b is disposed between and coupled to the first portion 106a and the second portion 106c. In some embodiments, the first portion 106a is surrounded by the second substrate 102a and the second dielectric layer 102b. In some embodiments, the tapered portion 106b and the second portion 106c are surrounded by the passivation 104. In some embodiments, a width of the tapered portion 106b decreases from the third width W4 to the second width W3.

In some embodiments, the second conductive via 106 has differing widths along a second height H4 of the second conductive via 106. In some embodiments, the first height H3 of the first conductive via 105 is substantially greater than the second height H4 of the second conductive via 106. In some embodiments, the second portion 106c having the third width W4 is above the first portion 106a having the second width W3. The first portion 106a is surrounded by the second wafer 102, and the second portion 106c is surrounded by the passivation 104. In some embodiments, the second width W3 of the second conductive via 106 is substantially less than the first width W1 of the first conductive via 105. In some embodiments, the third width W4 is substantially equal to the first width W1 and substantially greater than the second width W3.

In some embodiments, the semiconductor structure 100 further includes a dielectric liner 109 between the first conductive via 105 and the second wafer 102, and between the second conductive via 106 and the second wafer 102. In some embodiments, the dielectric liner 109 is disposed between the first conductive via 105 and the passivation 104, and between the second conductive via 106 and the passivation 104. In some embodiments, the dielectric liner 109 is disposed over the passivation 104. In some embodiments, each of the first conductive via 105 and the second conductive via 106 is entirely surrounded by the dielectric liner 109. In some embodiments, the dielectric liner 109 is in contact with the first conductive pad 101c and the second conductive pad 102c.

In some embodiments, a first top surface 105a of the first conductive via 105 and a second top surface 106d of the second conductive via 106 are exposed through the dielectric liner 109. In some embodiments, a top surface 109a of the dielectric liner 109 is substantially coplanar with the top surface 105a of the first conductive via 105 and the top surface 106d of the second conductive via 106. In some embodiments, the dielectric liner 109 includes dielectric material such as oxide or the like.

In some embodiments, the semiconductor structure 100 further includes a first trench 111 and a second trench 112. In some embodiments, the first trench 111 extends through the second wafer 102 and the passivation 104 and partially through the first dielectric layer 101b. In some embodiments, the second trench 112 extends through the passivation 104 and the second substrate 102a and partially through the second dielectric layer 102b. In some embodiments, the first trench 111 has a fourth width W2. In some embodiments, the trench 111 has a consistent width, equal to the fourth width W2, along the first height H3 of the first conductive via 105. In some embodiments, the second trench 112 has a fourth section having a fifth width W5, and a fifth section having a sixth width W6, wherein the fifth section is above the fourth section. In some embodiments, the fifth width W5 is substantially less than the sixth width W6. In some embodiments, the fourth width W2 is substantially equal to the sixth width W6.

Figure 2C:
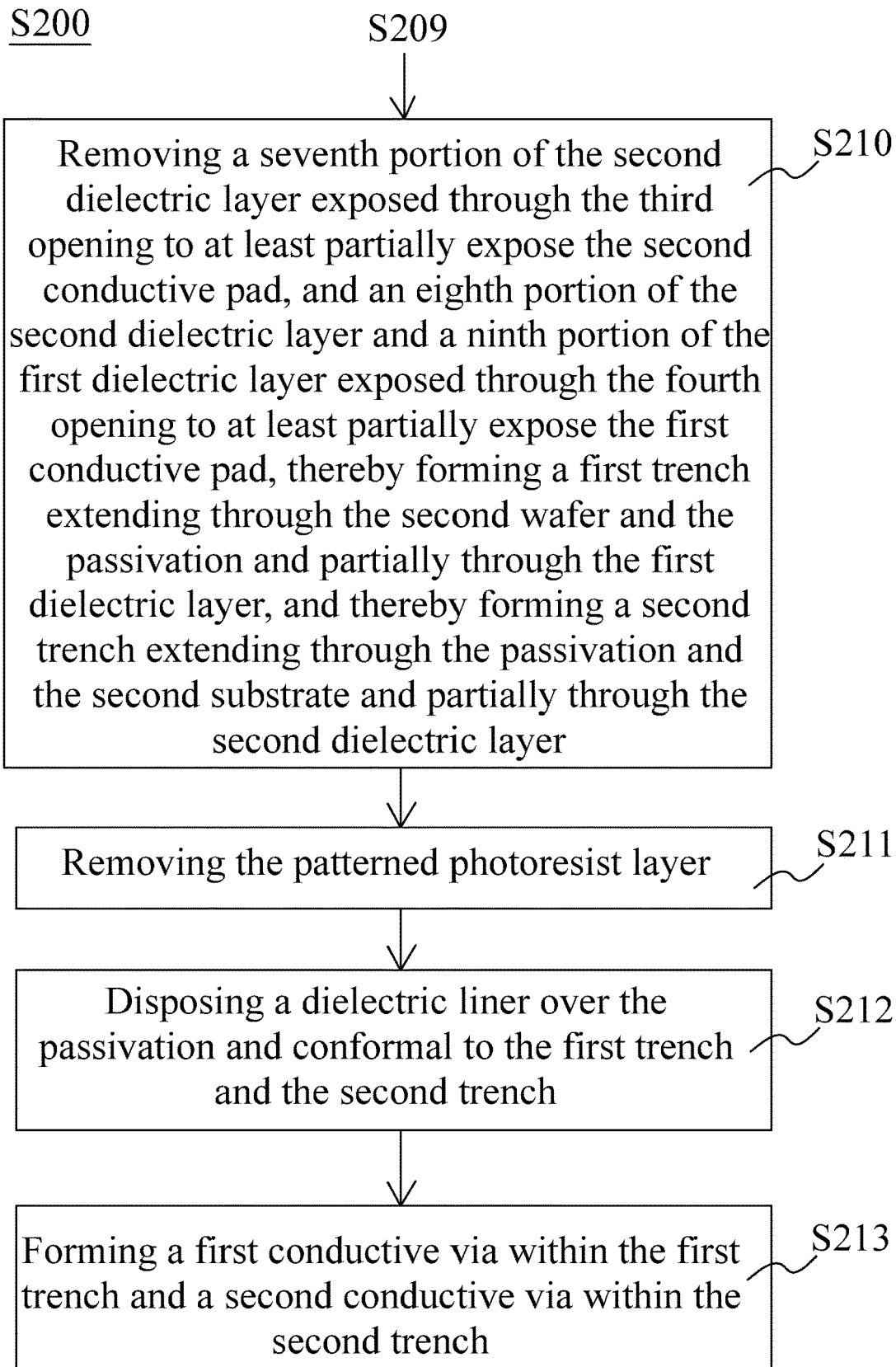

FIGS. 2A to 2C are flow diagrams illustrating a method S200 of manufacturing the semiconductor structure 100 in accordance with some embodiments of the present disclosure, and FIGS. 3 to 24 illustrate cross-sectional views of intermediate stages in the formation of the semiconductor structure 100 in accordance with some embodiments of the present disclosure.

The stages shown in FIGS. 3 to 24 are also illustrated schematically in the flow diagrams in FIGS. 2A to 2C. In the following discussion, the fabrication stages shown in FIGS. 3 to 24 are discussed in reference to the process steps shown in FIGS. 2A to 2C. The method S200 includes a number of operations and the description and illustration are not deemed as a limitation as the sequence of the operations. The method S200 includes a number of steps (S201, S202, S203, S204, S205, S206, S207, S208, S209, S210, S211, S212 and S213).

Figure 3:
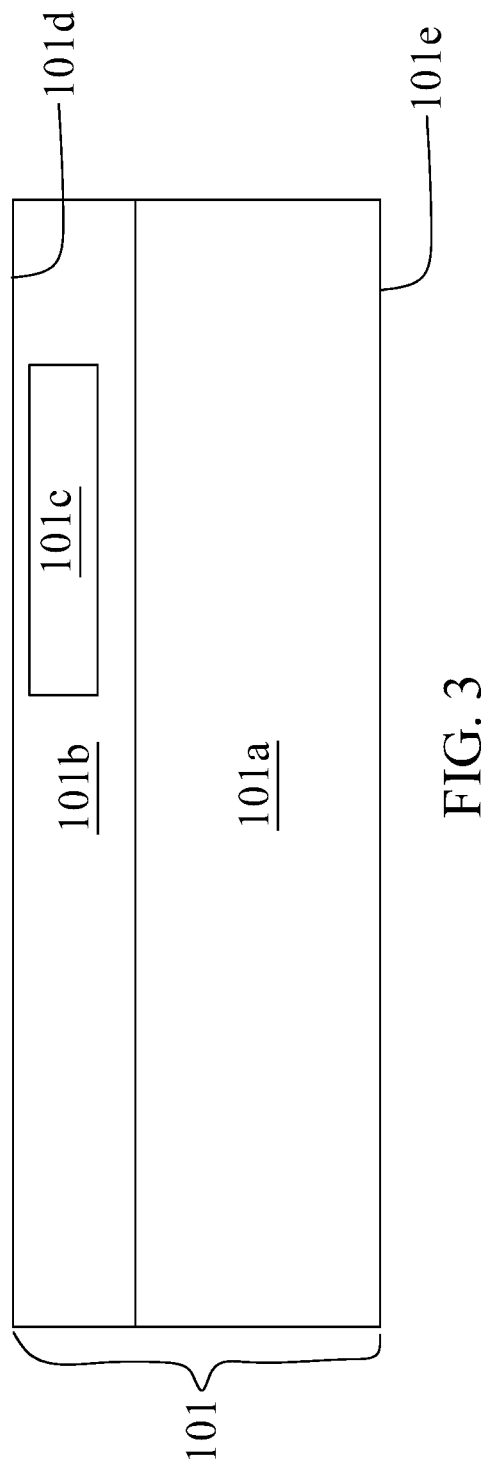
FIGS. 3 through 24 illustrate cross-sectional views of intermediate stages in the formation of a semiconductor structure in accordance with some embodiments of the present disclosure.

Referring to FIG. 3, a first wafer 101 is provided according to step S201 in FIG. 2A. In some embodiments, the first wafer 101 has a first surface 101d and a second surface 10l opposite to the first surface 101d. In some embodiments, the first wafer 101 includes a first substrate 101a, a first dielectric layer 101b disposed over the first substrate 101a, and a first conductive pad 101c surrounded by the first dielectric layer 101b. In some embodiments, the first dielectric layer 101b is formed on the first substrate 101a by deposition, chemical vapor deposition (CVD) or another suitable operation.

In some embodiments, the first conductive pad 101c is formed by removing a portion of the first dielectric layer 101b to form a recess and disposing a conductive material to fill the recess to form the first conductive pad 101c. In some embodiments, the conductive material is disposed by electroplating, sputtering or another suitable operation. In some embodiments, the first wafer 101, the first substrate 101a, the first dielectric layer 101b and the first conductive pad 101c have configurations similar to those described above or illustrated in FIG. 1.

Figure 4:
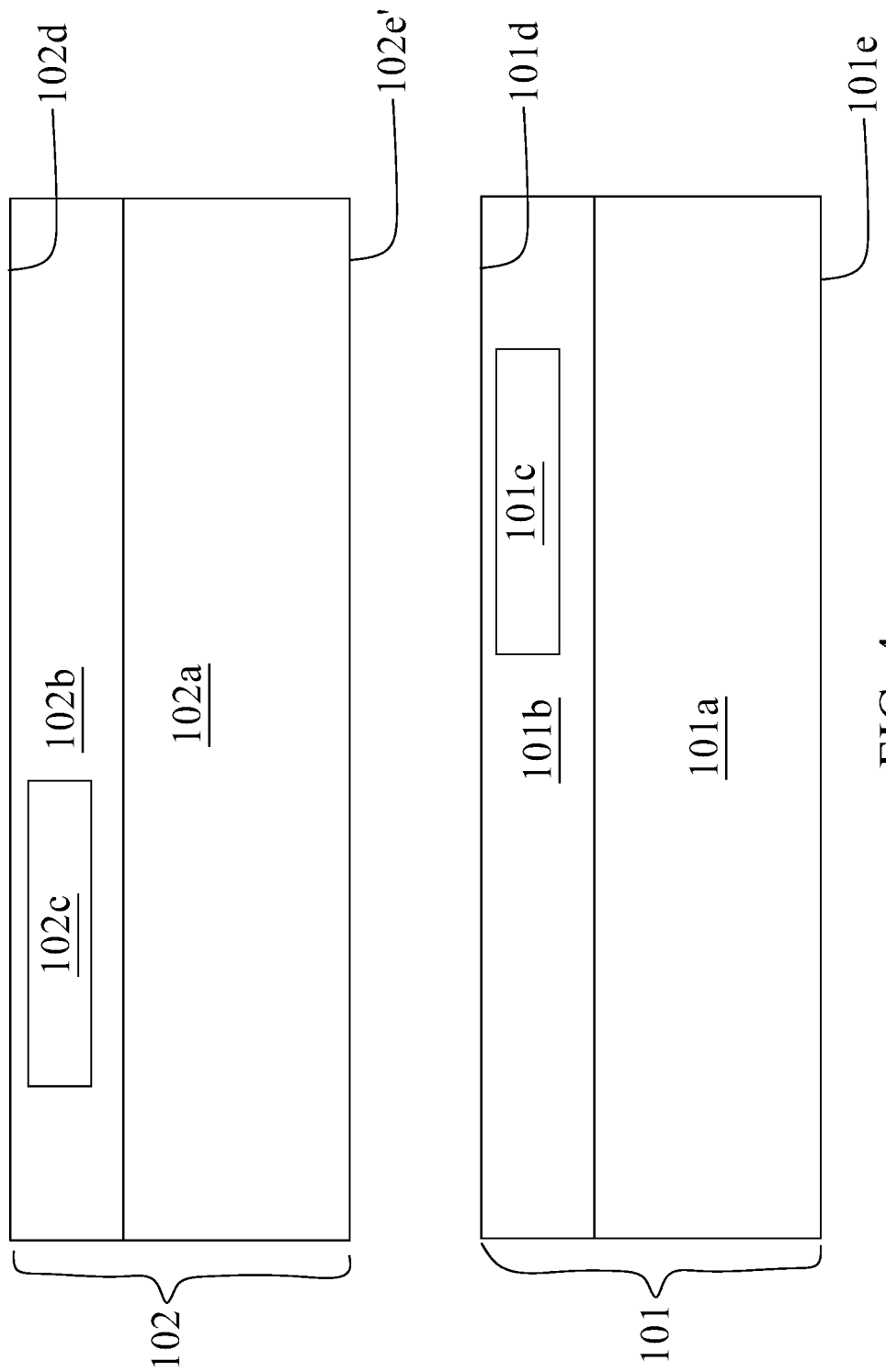

Referring to FIG. 4, a second wafer 102 is provided according to step S202 in FIG. 2A. In some embodiments, the second wafer 102 includes a third surface 102d and an untreated fourth surface 102e' opposite to the third surface 102d. In some embodiments, the second wafer 102 includes a second substrate 102a, a second dielectric layer 102b over the second substrate 102a, and a second conductive pad 102c surrounded by the second dielectric layer 102b. In some embodiments, the second dielectric layer 102b is formed on the second substrate 102a by deposition, CVD or another suitable operation.

In some embodiments, the second conductive pad 102c is formed by removing a portion of the second dielectric layer 102b to form a recess and disposing a conductive material to fill the recess to form the second conductive pad 102c. In some embodiments, the conductive material is disposed by electroplating, sputtering or another suitable operation. In some embodiments, the second wafer 102, the second substrate 102a, the second dielectric layer 102b and the second conductive pad 102c have configurations similar to those described above or illustrated in FIG. 1.

Figure 8:
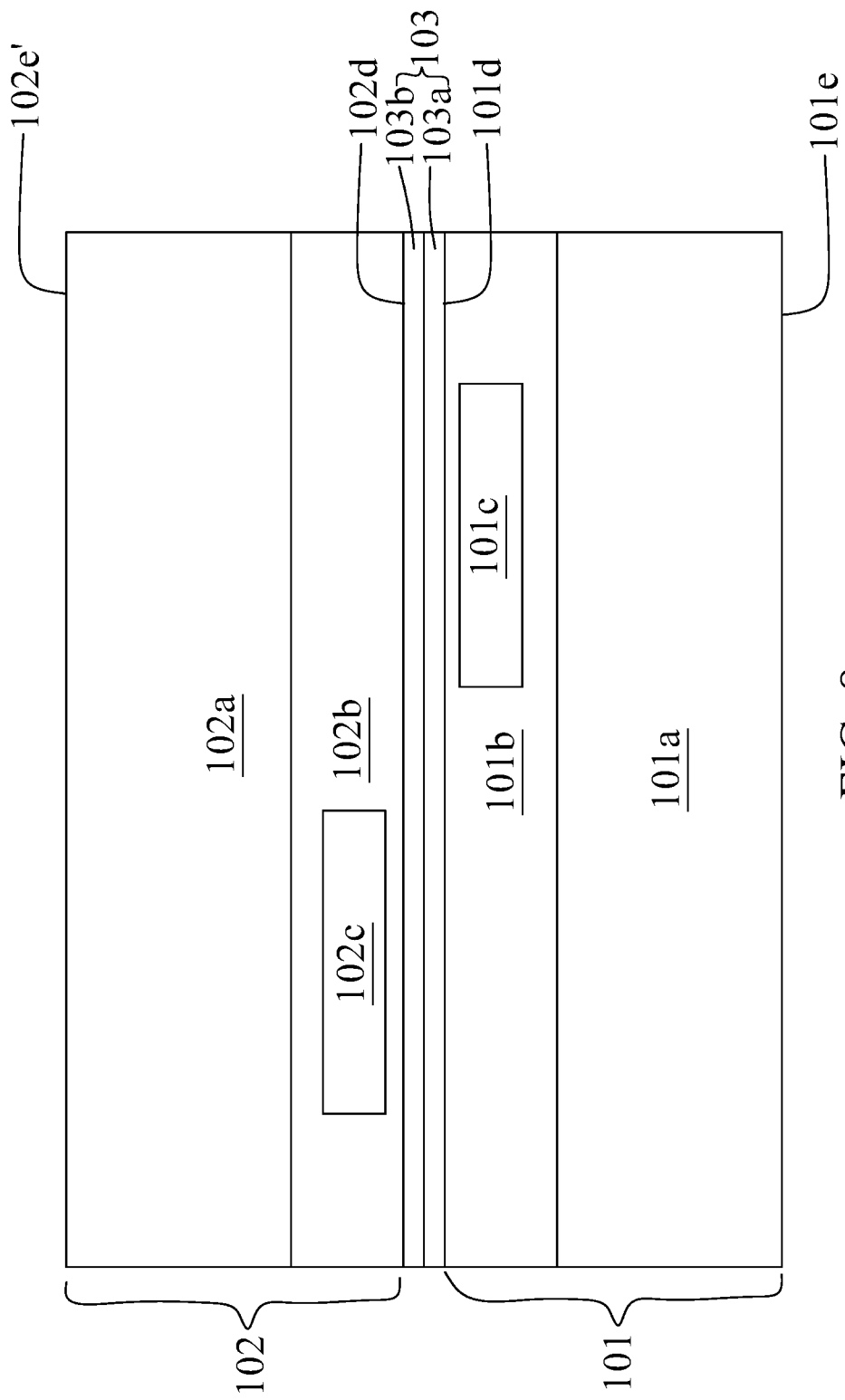

In some embodiments, a bonding dielectric 103 is formed between the first wafer 101 and the second wafer 102 as shown in FIG. 8. In some embodiments, the bonding dielectric 103 is formed over the first wafer 101 or the second wafer 102. In some embodiments, the bonding dielectric 103 is formed over the first surface 101d or the third surface 102d. In some embodiments, the bonding dielectric 103 has a configuration similar to that described above or illustrated in FIG. 1.

Figure 5:
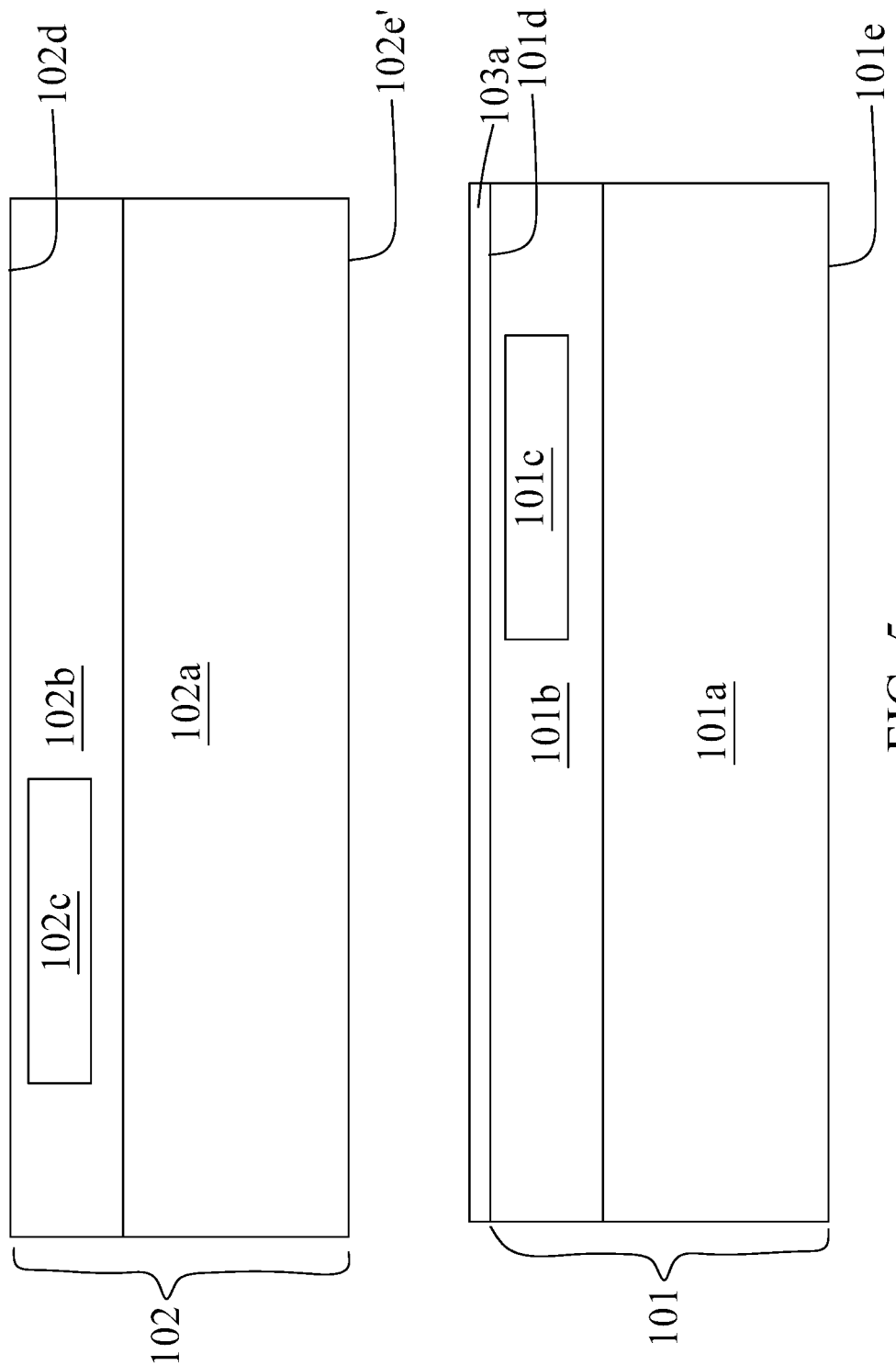
Figure 6:
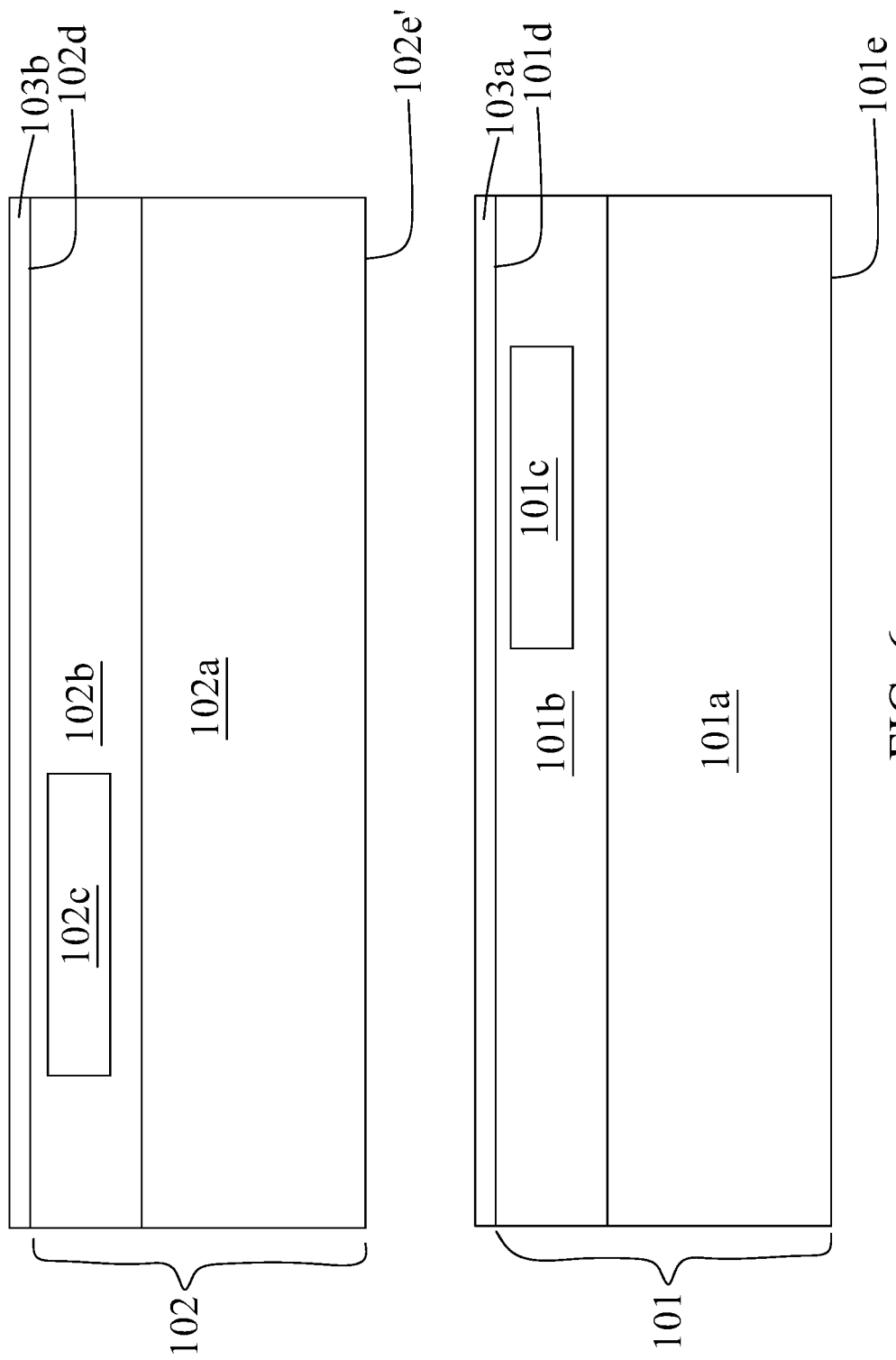

In some embodiments, the formation of the bonding dielectric 103 includes disposing a first bonding dielectric layer 103a over the first wafer 101 as shown in FIG. 5, and disposing a second bonding dielectric layer 103b over the second wafer 102 as shown in FIG. 6. In some embodiments, the first bonding dielectric layer 103a is disposed over the first surface 101d as shown in FIG. 5, and the second bonding dielectric layer 103b is disposed over the third surface 102d as shown in FIG. 6. In some embodiments, the disposing of the first bonding dielectric layer 103a as shown in FIG. 5 and the disposing of the second bonding dielectric layer 103b as shown in FIG. 6 are performed separately or simultaneously.

Figure 7:
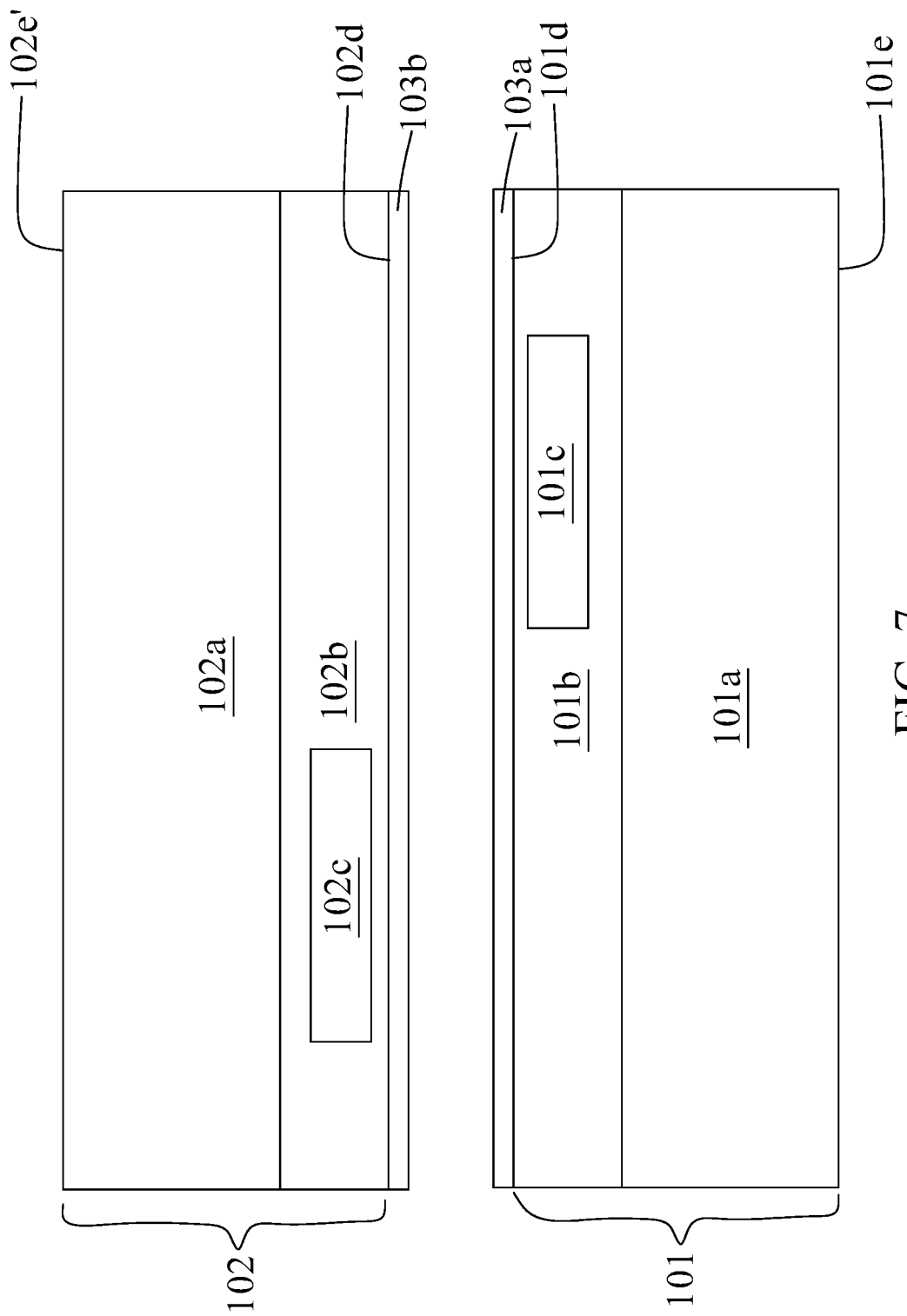

In some embodiments, after the disposing of the first bonding dielectric layer 103a on the first wafer 101 and the disposing of the second bonding dielectric layer 103b on the second wafer 102, the second wafer 102 is flipped as shown in FIG. 7, such that the first dielectric layer 101b and the second dielectric layer 102b are adjacent to and opposite to each other. In some embodiments, the first surface 101d faces the third surface 102d.

Referring to FIG. 8, the first dielectric layer 101b is bonded to the second dielectric layer 101c according to step S203 in FIG. 2A. In some embodiments, the second wafer 102 is bonded over the first wafer 101. In some embodiments, the second wafer 102 is flipped prior to the bonding of the first dielectric layer 101b to the second dielectric layer 102b. In some embodiments, the first dielectric layer 101b is bonded to the second dielectric layer 101c by the bonding dielectric 103. In some embodiments, the first wafer 101 and the second wafer 102 are bonded by oxide-to-oxide bonding technique or another suitable operation.

Figure 9:
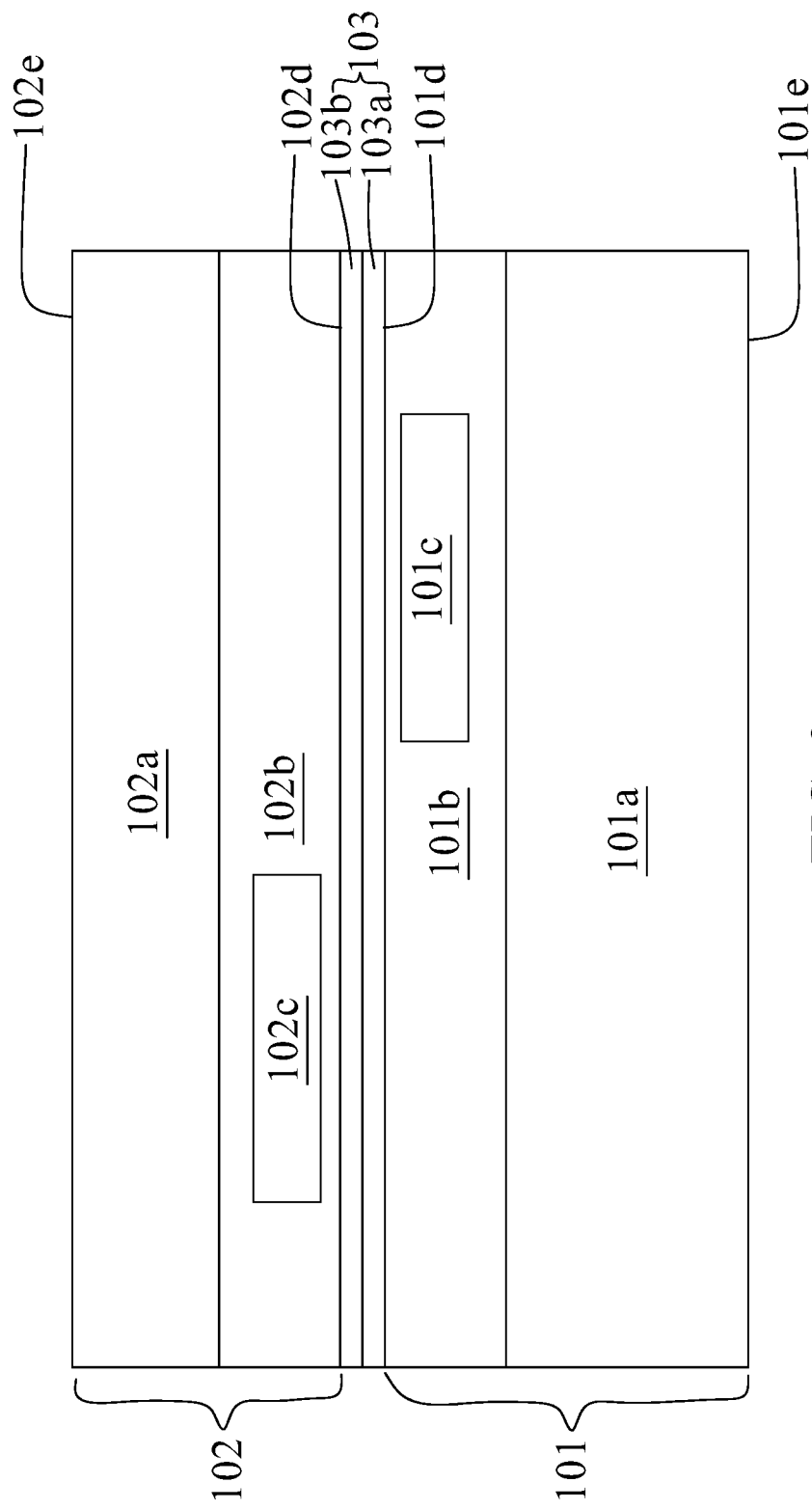

In some embodiments, after the bonding of the first wafer 101 to the second wafer 102, the second substrate 102a is ground as shown in FIG. 9. In some embodiments, a thickness of the second substrate 102a is reduced by grinding, etching, chemical mechanical planarization (CMP) or another suitable operation. In some embodiments, the second substrate 102a is planarized, and the untreated fourth surface 102e' becomes a fourth surface 102e after the reduction of the thickness of the second substrate 102a. In some embodiments, the thickness of the second substrate 102a is substantially less than a thickness of the first substrate 101a.

Figure 10:
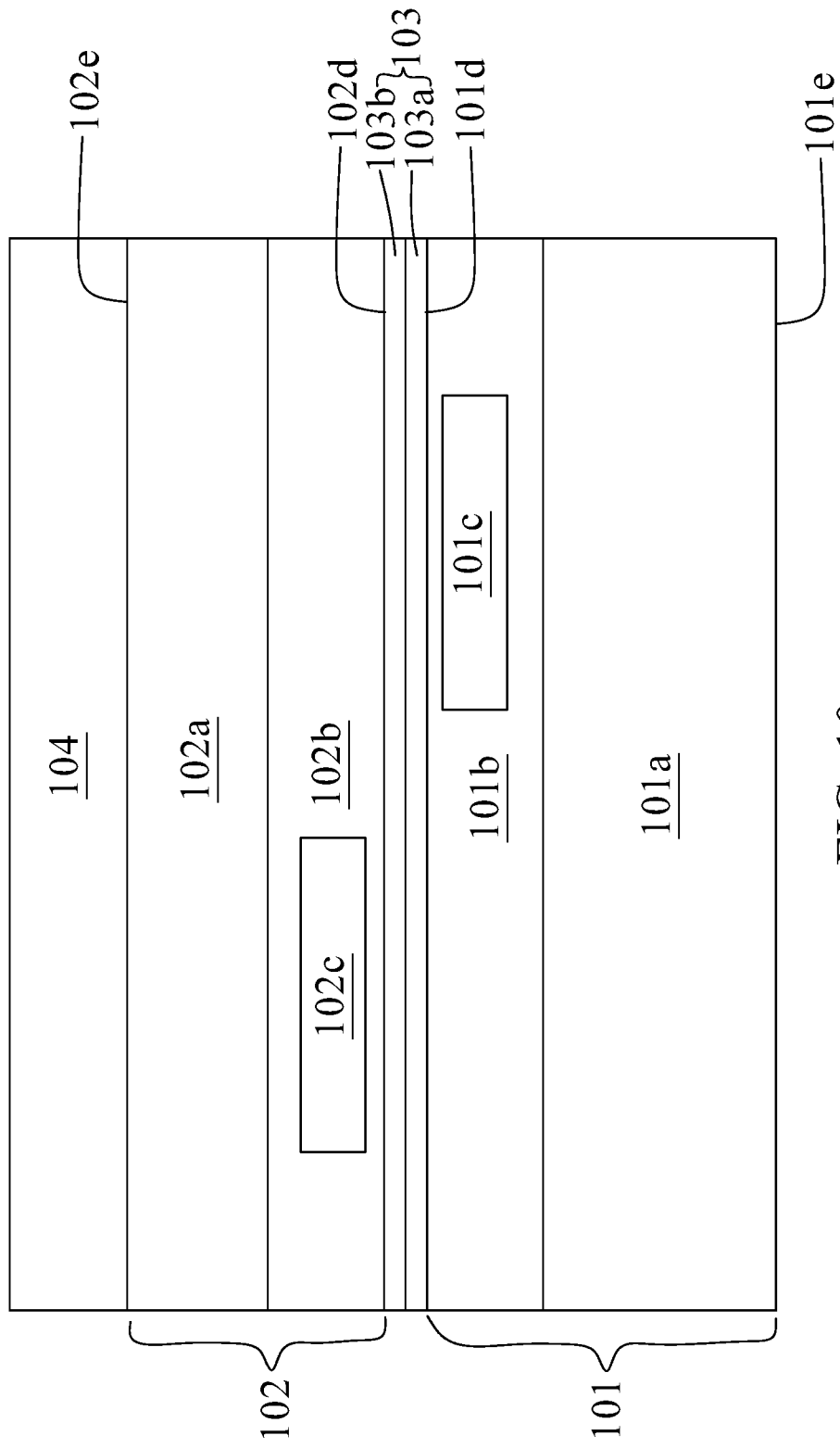

Referring to FIG. 10, a passivation 104 is disposed over the second wafer 102 according to step S204 in FIG. 2A. In some embodiments, after the reduction of the thickness of the second substrate 102a, the passivation 104 is disposed over the second wafer 102. In some embodiments, the passivation 104 is formed over the second substrate 102a. In some embodiments, the passivation 104 is formed by deposition, CVD or another suitable operation. In some embodiments, the passivation 104 has a configuration similar to that described above or illustrated in FIG. 1.

Figure 11:
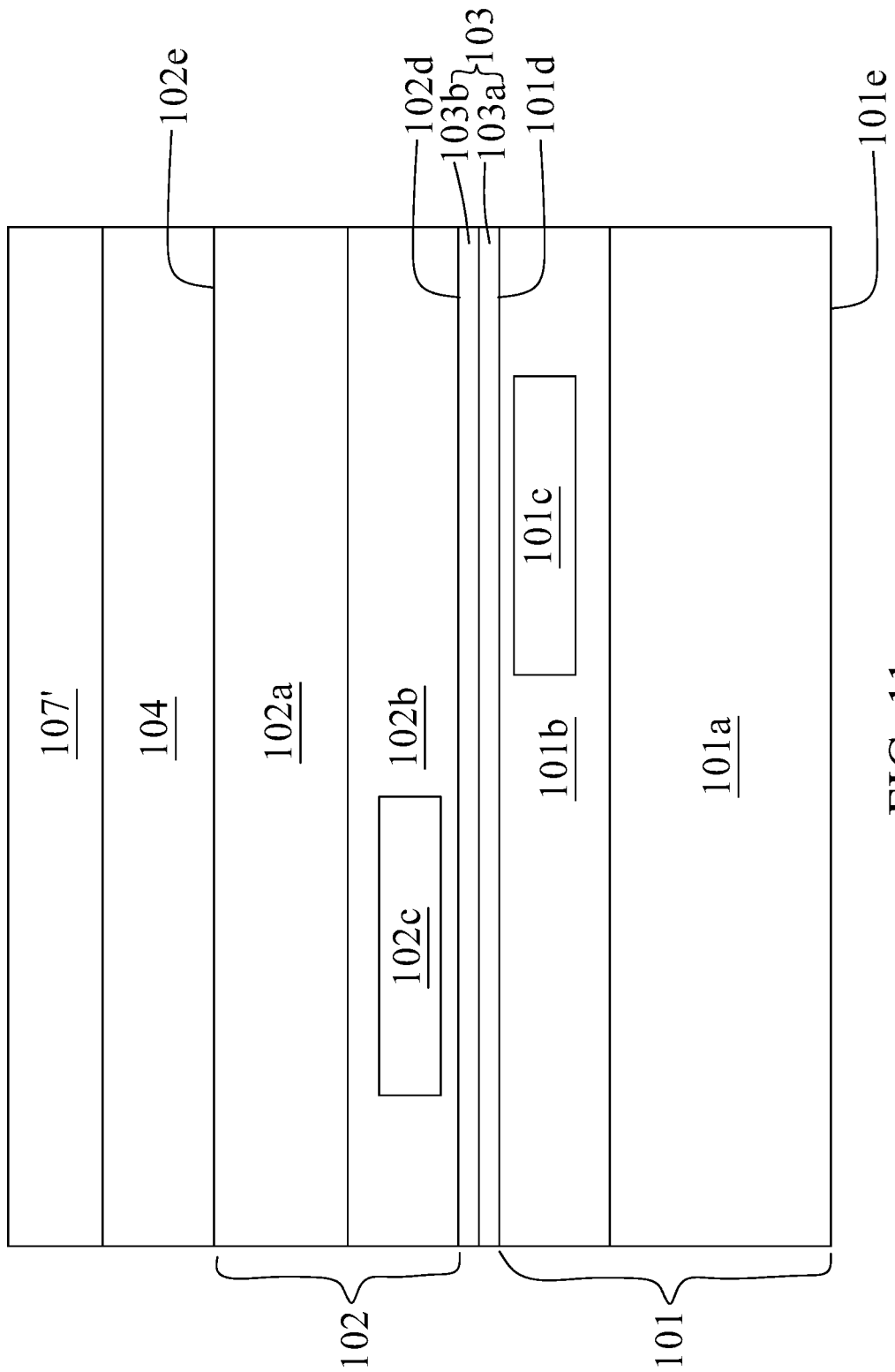
Figure 12:
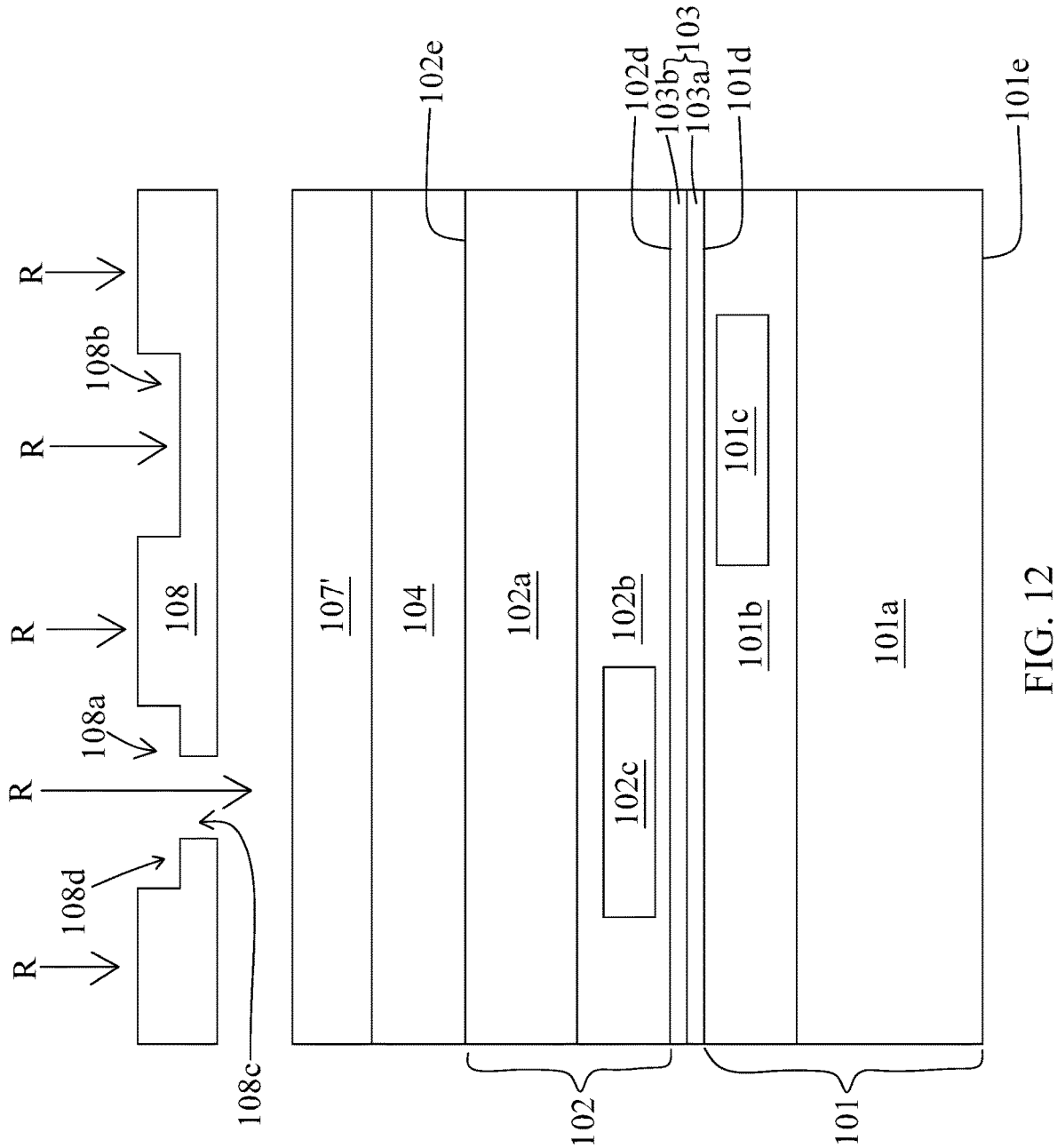
Figure 13:
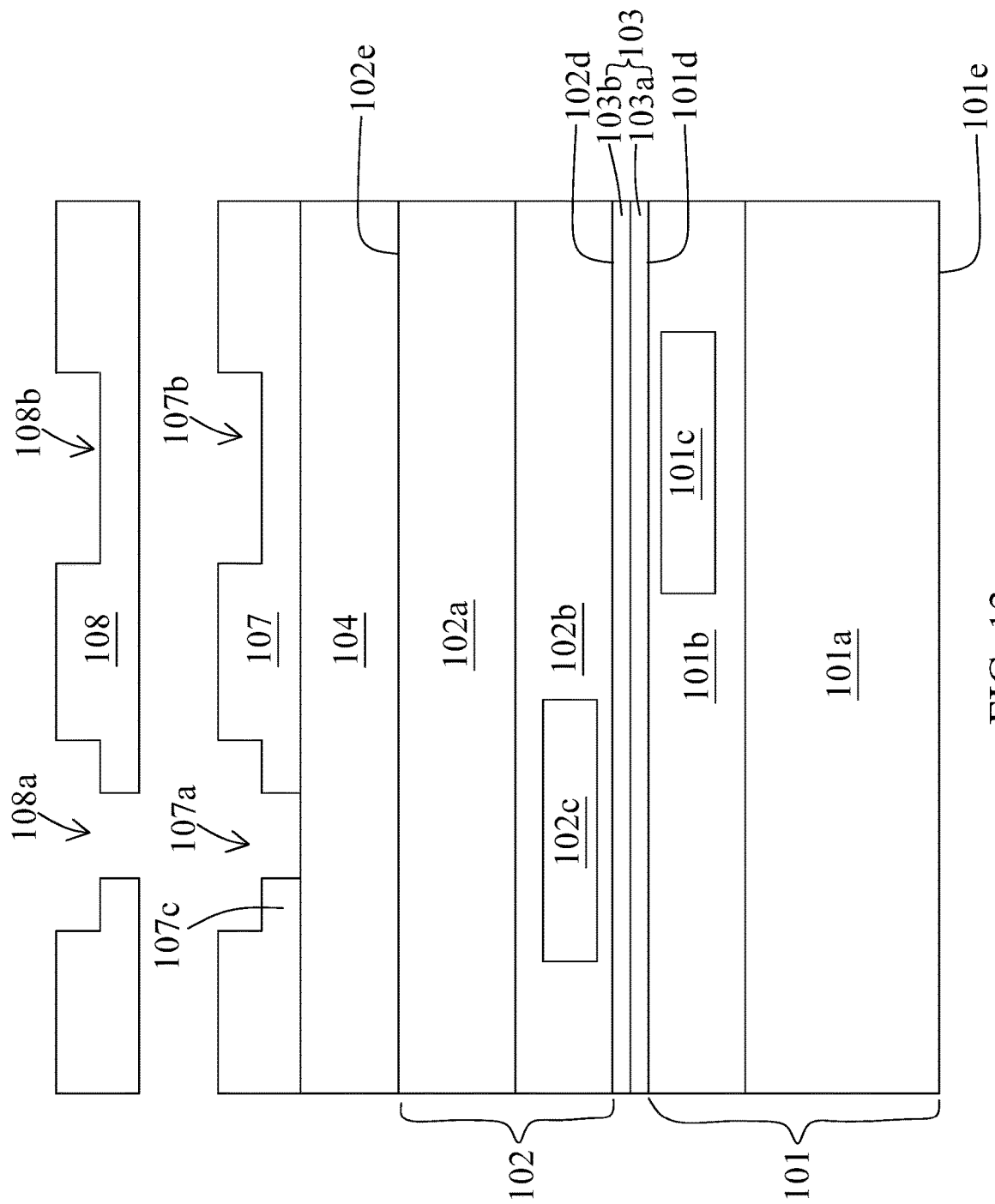

Referring to FIG. 13, a patterned photoresist layer 107 is formed over the passivation 104 according to step S205 in FIG. 2A. In some embodiments, prior to the formation of the patterned photoresist layer 107, a photoresist layer 107' is disposed over the passivation 104 as shown in FIG. 11, and a mask 108 is disposed over the photoresist layer 107' as shown in FIG. 12. In some embodiments, the photoresist layer 107' is disposed by spin coating or another suitable operation. In some embodiments, an exposure process and a develop process are applied to the photoresist layer 107' with the use of the mask 108.

In some embodiments, after the disposing of the mask 108 above the photoresist layer 107', a predetermined electromagnetic radiation R is provided over the mask 108 and then the mask 108 is irradiated with the predetermined electromagnetic radiation R as shown in FIG. 12. In some embodiments, the predetermined electromagnetic radiation R is ultraviolet (UV), light or the like.

In some embodiments, the mask 108 includes a second through hole 108a and a second indentation 108b. In some embodiments, the second through hole 108a has a central region 108c and a peripheral region 108d surrounding the central region 108c. In some embodiments, the central region 108c has a first transmission rate equal to an amount of the predetermined electromagnetic radiation R allowed to pass through the central region 108c, the peripheral region 108d has a second transmission rate equal to an amount of the predetermined electromagnetic radiation R allowed to pass through the peripheral region 108d, and the second indentation 108b has a third transmission rate equal to an amount of the predetermined electromagnetic radiation R allowed to pass through the second indentation 108b.

In some embodiments, the first transmission rate is substantially different from the second transmission rate. In some embodiments, the first transmission rate is substantially different from the third transmission rate. In some embodiments, the first transmission rate is substantially greater than the second transmission rate. In some embodiments, the first transmission rate is substantially greater than the third transmission rate.

In some embodiments, the first transmission rate is about 100%. That is, the predetermined electromagnetic radiation R can completely pass through the mask 108 via the central region 108c of the second through hole 108a. In some embodiments, the second transmission rate is about 6%. In some embodiments, the second transmission rate is about 5% to 10%. That is, the predetermined electromagnetic radiation R can only partially pass through the mask 108 via the peripheral region 108d of the second through hole 108a.

In some embodiments, the third transmission rate is substantially less than 6%. In some embodiments, the third transmission rate is substantially less than 10%. That is, the predetermined electromagnetic radiation R can only partially pass through the mask 108 via the second indentation 108b. In some embodiments, the third transmission rate is 0%. That is, the predetermined electromagnetic radiation R cannot pass through the mask 108 via the second indentation 108b.

In some embodiments, different portions of the photoresist layer 107' are exposed to different amount of the predetermined electromagnetic radiation R. In some embodiments, a portion of the photoresist layer 107' vertically aligned with the central region 108c receives the predetermined electromagnetic radiation R completely passing through the central region 108c. In some embodiments, the portion of the photoresist layer 107' is exposed to 100% or nearly 100% of the predetermined electromagnetic radiation R.

In some embodiments, another portion of the photoresist layer 107' vertically aligned with the peripheral region 108d receives the predetermined electromagnetic radiation R partially passing through the peripheral region 108d. In some embodiments, the another portion of the photoresist layer 107' is exposed to about 5% to 10% of the predetermined electromagnetic radiation R. In some embodiments, the another portion of the photoresist layer 107' is exposed to about 6% of the predetermined electromagnetic radiation R.

In some embodiments, another portion of the photoresist layer 107' vertically aligned with the second indentation 108b receives the predetermined electromagnetic radiation R partially passing through the second indentation 108b. In some embodiments, the another portion of the photoresist layer 107' is exposed to substantially less than 6% of the predetermined electromagnetic radiation R.

In some embodiments, a remaining portion of the photoresist layer 107' does not receive any predetermined electromagnetic radiation R. In some embodiments, the remaining portion of the photoresist layer 107' is exposed to 0%, or substantially none, of the predetermined electromagnetic radiation R.

In some embodiments, after the irradiation of the mask 108 with the predetermined electromagnetic radiation R, the portions of the photoresist layer 107' exposed to the predetermined electromagnetic radiation R are removed to form the patterned photoresist layer 107. In some embodiments, the patterned photoresist layer 107 having a first through hole 107a and a first indentation 107b is formed as shown in FIG. 13.

In some embodiments, the portion of the photoresist layer 107' exposed to 100% or nearly 100% of the predetermined electromagnetic radiation R is entirely removed, and the portion of the photoresist layer 107' exposed to about 5% to 10% of the predetermined electromagnetic radiation R is partially removed, so that the first through hole 107a having a stepped profile is formed. In some embodiments, the first through hole 107a has the stepped profile and has a step portion 107c protruding inwardly toward the first through hole 107a.

In some embodiments, the portion of the photoresist layer 107' exposed to substantially less than 6% of the predetermined electromagnetic radiation R is partially removed, so that the first indentation 107b is formed. In some embodiments, the second through hole 108a is vertically aligned with and corresponds to the first through hole 107a, and the second indentation 108b is vertically aligned with and corresponds to the first indentation 107b.

Figure 14:
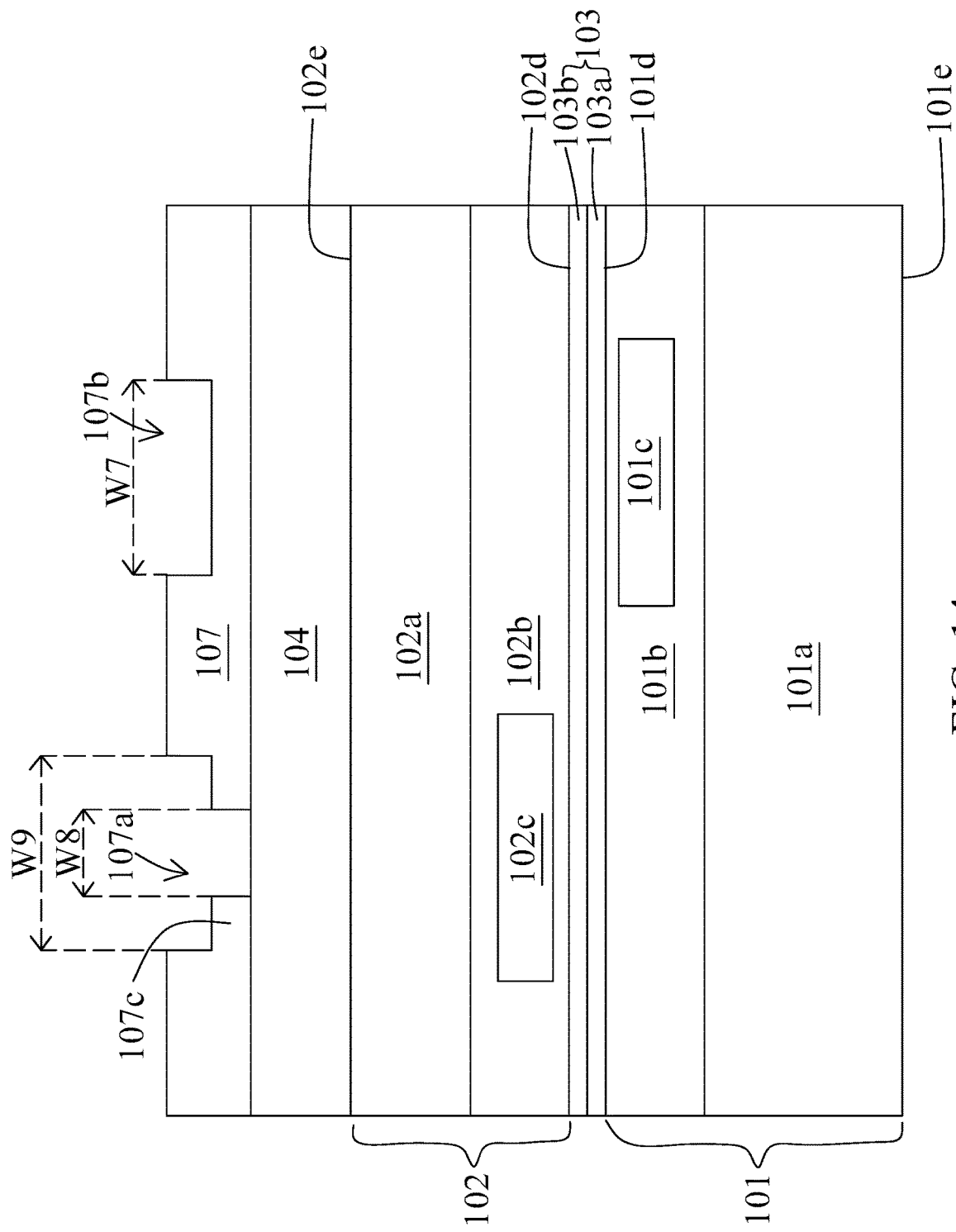

In some embodiments, the mask 108 is removed as shown in FIG. 14 after the irradiation of the mask 108 with the predetermined electromagnetic radiation R or after the formation of the patterned photoresist layer 107. In some embodiments, the first indentation 107b has a seventh width W7, and the first through hole 107a has an eighth width W8 and a ninth width W9, wherein a portion having the ninth width W9 is above a portion having the eighth width W8, and the ninth width W9 is substantially greater than the eighth width W8. In some embodiments, the seventh width W7 is substantially greater than the eighth width W8 and is substantially equal to the ninth width W9.

Figure 15:
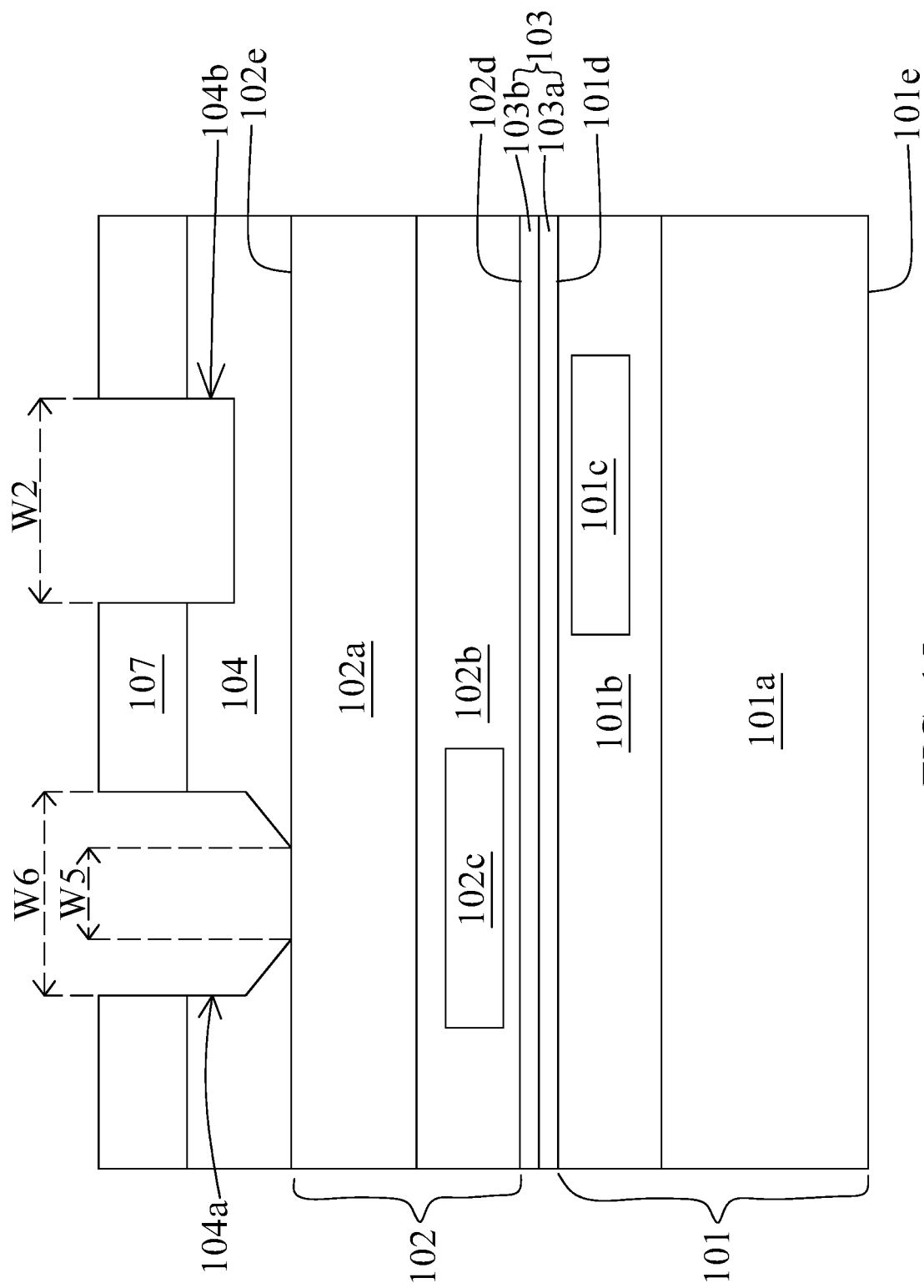

Referring to FIG. 15, a first portion of the passivation 104 exposed through the first through hole 107a (shown in FIG. 14) is removed to form a first opening 104a, and a second portion of the passivation 104 under the first indentation 107b (shown in FIG. 14) is removed to form a first recess 104b according to step S206 in FIG. 2B. In some embodiments, the first portion and the second portion of the passivation 104 are removed by dry etching or any other suitable process. In some embodiments, the first opening 104a extends through the passivation 104, and the first recess 104b extends partially through the passivation 104. In some embodiments, a portion of the first through hole 107a (shown in FIG. 14) and a portion of the first indentation 107b (shown in FIG. 14) are also removed during the formation of the first opening 104a and the first recess 104b respectively.

In some embodiments, the first opening 104a is tapered toward the second substrate 102a. In some embodiments, the first opening 104a has a fifth width W5 and a sixth width W6 at a position above a position of the fifth width W5. In some embodiments, the fifth width W5 is substantially less than the sixth width W6. In some embodiments, the first recess 104b has a fourth width W2 substantially greater than the fifth width W5 and substantially equal to the sixth width W6. In some embodiments, the fourth width W2, the fifth width W5 and the sixth width W6 are substantially equal to the seventh width W7, the eighth width W8 and the ninth width W9 (shown in FIG. 14) respectively.

Figure 16:
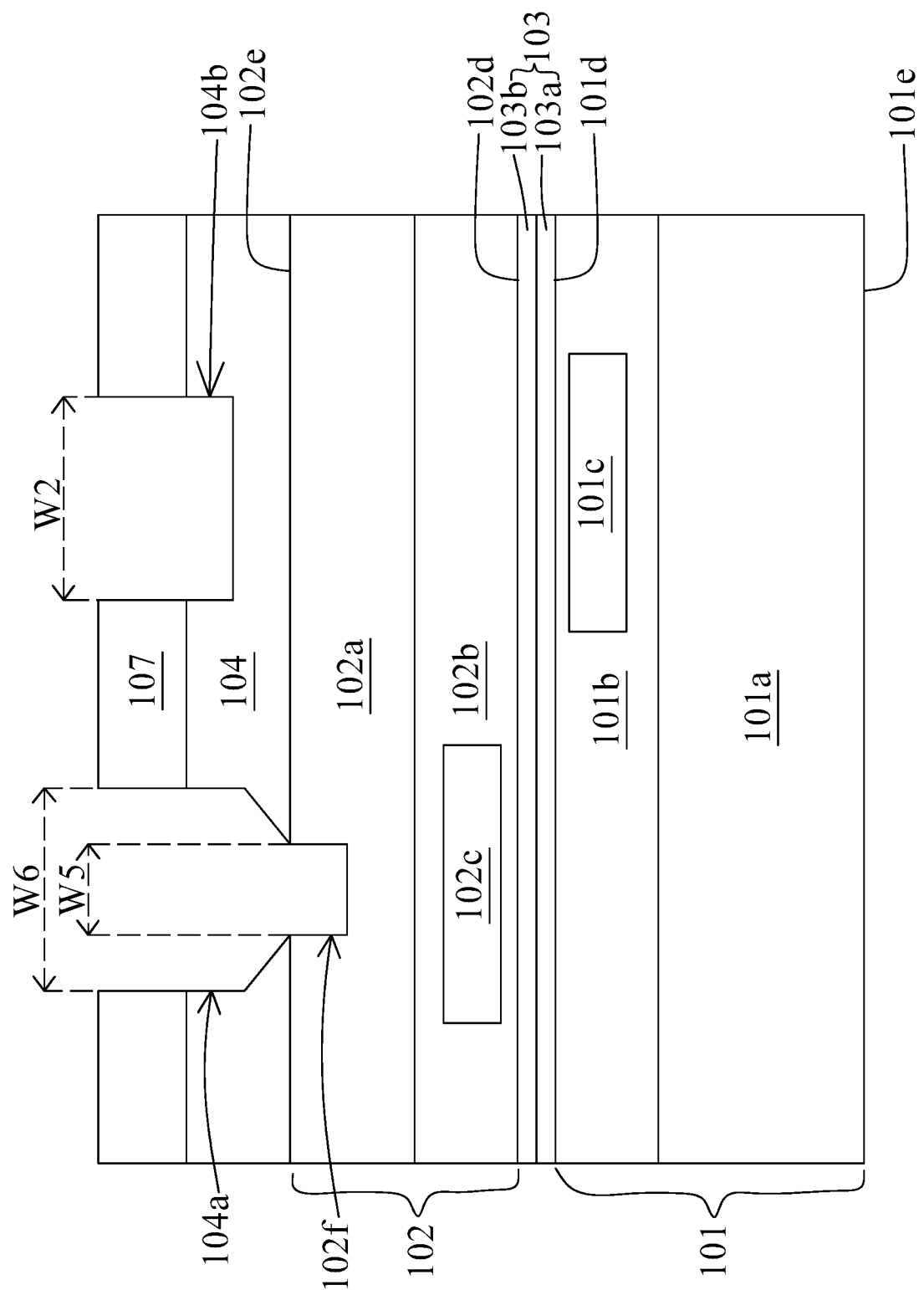

Referring to FIG. 16, a third portion of the second substrate 102a exposed through the first opening 104a is removed to form a second recess 102f according to step S207 in FIG. 2B. In some embodiments, the third portion of the second substrate 102a is removed by dry etching or any other suitable process. In some embodiments, the formation of the second recess 102f and the formation of the first opening 104a are implemented at different process chambers. In some embodiments, a depth of the second recess 102f is in a range between about 1 μm and about 5 μm. In some embodiments, the depth of the second recess 102f is about 2 μm.

Figure 17:
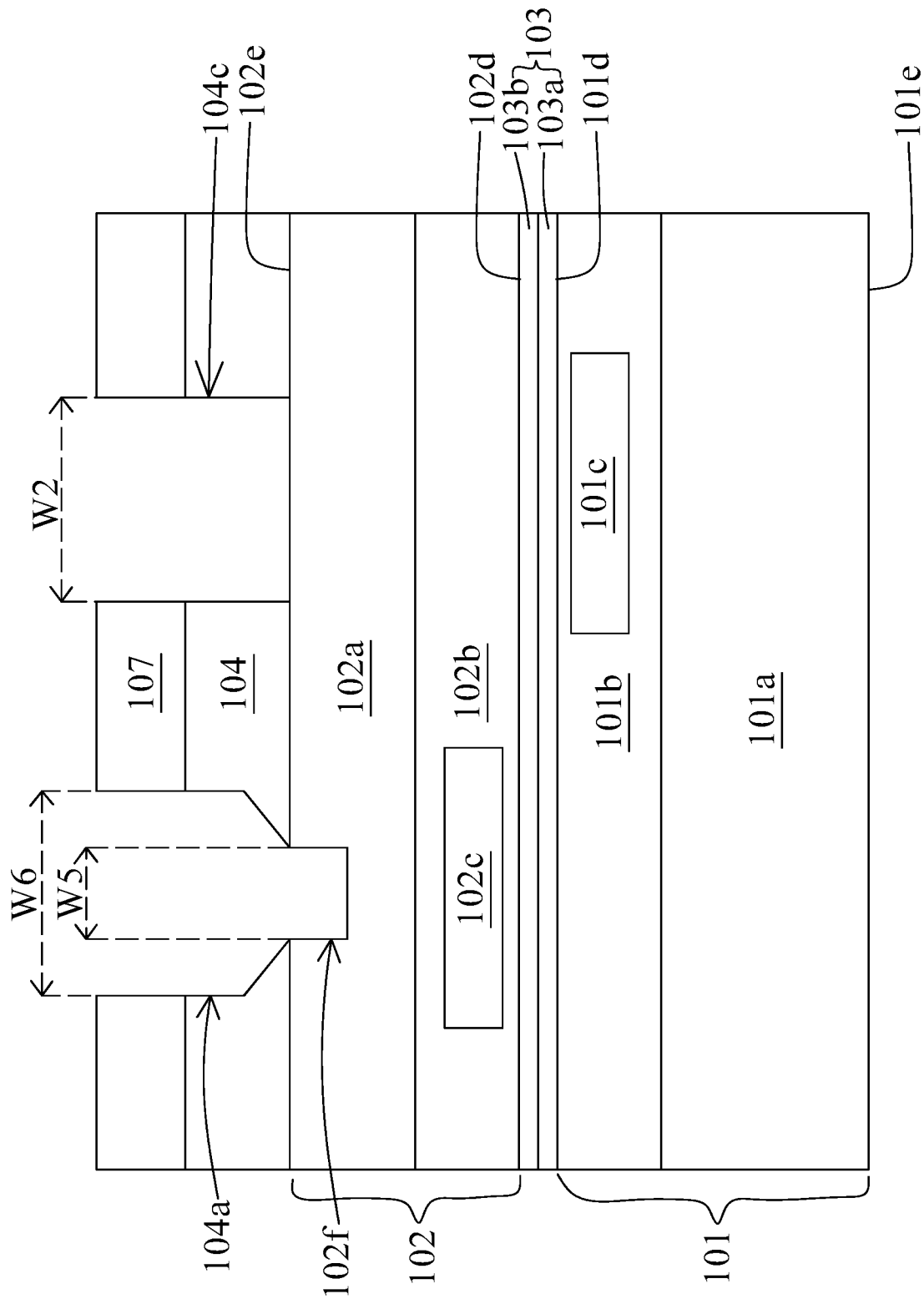

Referring to FIG. 17, a fourth portion of the passivation 104 under the first recess 104b (shown in FIG. 16) is removed to form a second opening 104c according to step S208 in FIG. 2B. In some embodiments, the fourth portion of the passivation 104 is removed by dry etching or any other suitable process. In some embodiments, the formation of the second opening 104c and the formation of the second recess 102f are implemented at different process chambers. In some embodiments, the second opening 104c extends through the passivation 104.

Figure 18:
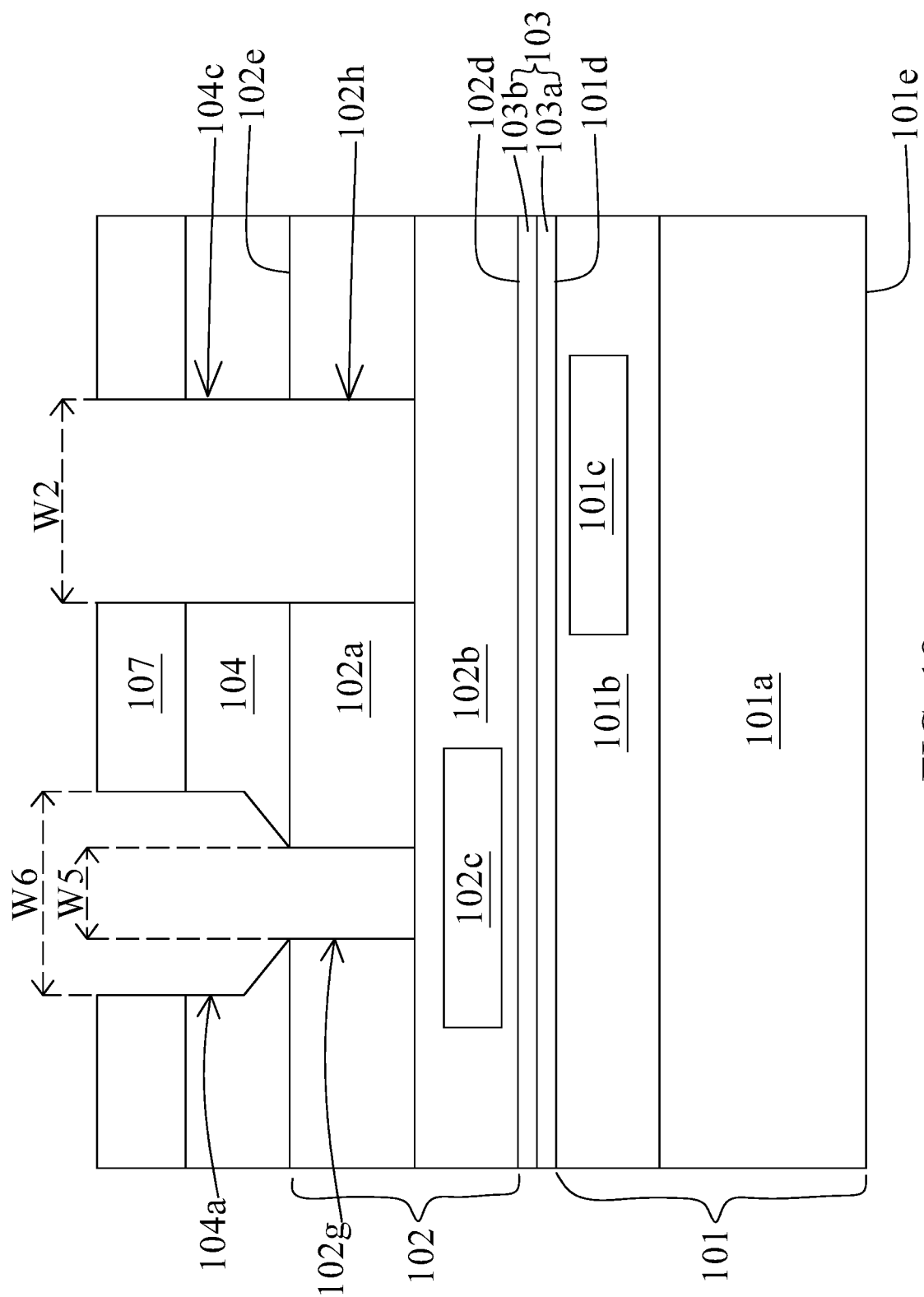

Referring to FIG. 18, a fifth portion of the second substrate 102a under the second recess 102f (shown in FIG. 17) is removed to form a third opening 102g, and a sixth portion of the second substrate 102a exposed through the second opening 104c is removed to form a fourth opening 102h according to step S209 in FIG. 2B. In some embodiments, the fifth portion and the sixth portion of the second substrate 102a are removed by dry etching or any other suitable process. In some embodiments, the formation of the third opening 102g and the fourth opening 102h and the formation of the second opening 104c are implemented at different process chambers. In some embodiments, the third opening 102g and the fourth opening 102h extend through the second substrate 102a.

Figure 19:
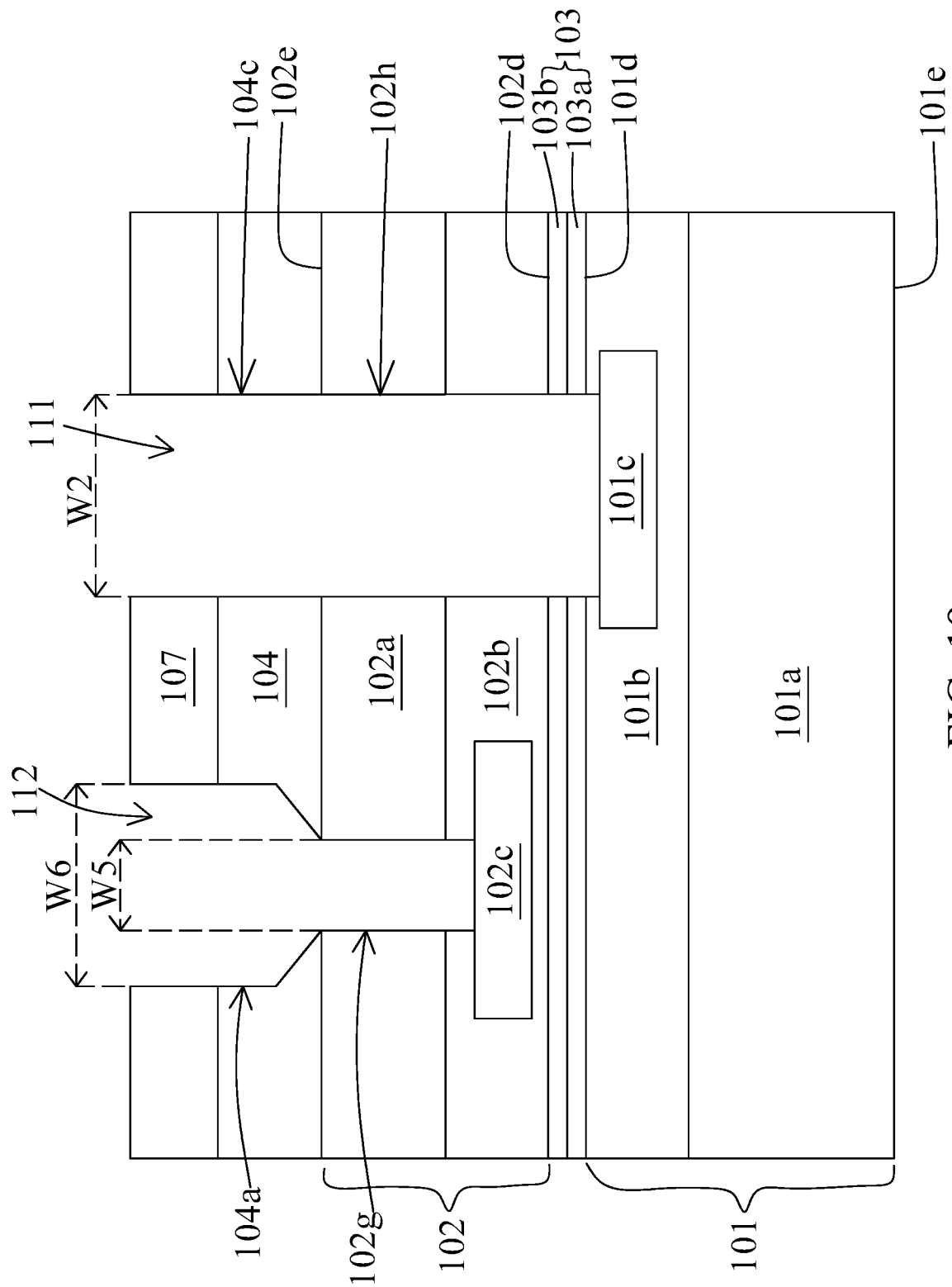

Referring to FIG. 19, a seventh portion of the second dielectric layer 102b exposed through the third opening 102g is removed to at least partially expose the second conductive pad 102c, and an eighth portion of the second dielectric layer 102b and a ninth portion of the first dielectric layer 101b exposed through the fourth opening 102h are removed to at least partially expose the first conductive pad 101c according to step S210 in FIG. 2C.

In some embodiments, the seventh portion of the second dielectric layer 102b, the eighth portion of the second dielectric layer 102b and the ninth portion of the first dielectric layer 101b are removed by dry etching or any other suitable process. In some embodiments, the seventh portion of the second dielectric layer 102b, the eighth portion of the second dielectric layer 102b and the ninth portion of the first dielectric layer 101b are removed simultaneously or separately. In some embodiments, a portion of the bonding dielectric 103 exposed through the fourth opening 102h is also removed. As a result, a first trench 111 extending through the second wafer 102, the passivation 104 and partially through the first dielectric layer 101b, and a second trench 112 extending through the passivation 104 and the second substrate 102a and partially through the second dielectric layer 102b are formed.

Figure 20:
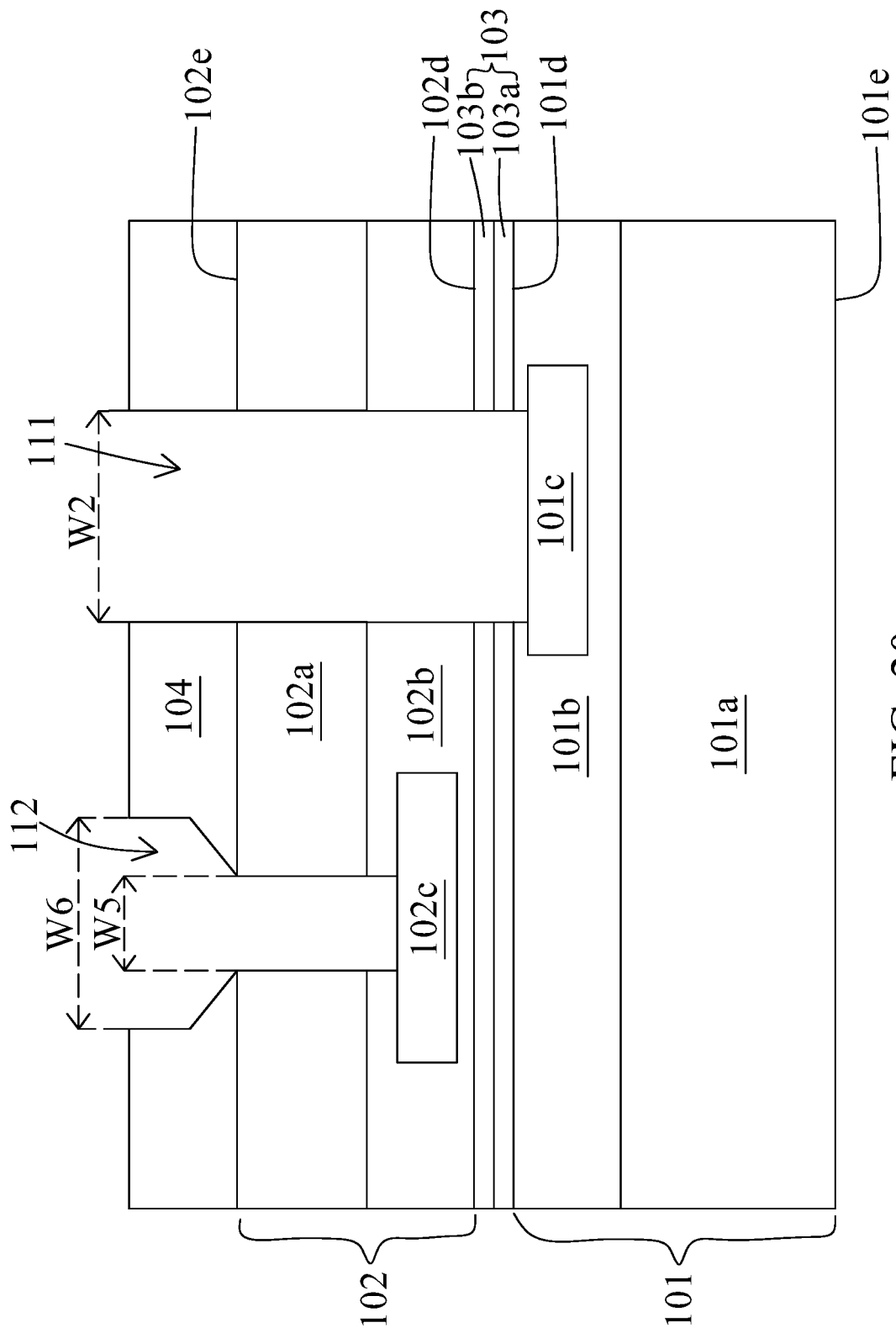

Referring to FIG. 20, the patterned photoresist layer 107 is removed according to step S211 in FIG. 2C. In some embodiments, the patterned photoresist layer 107 is removed by stripping, etching or another suitable process.

Figure 21:
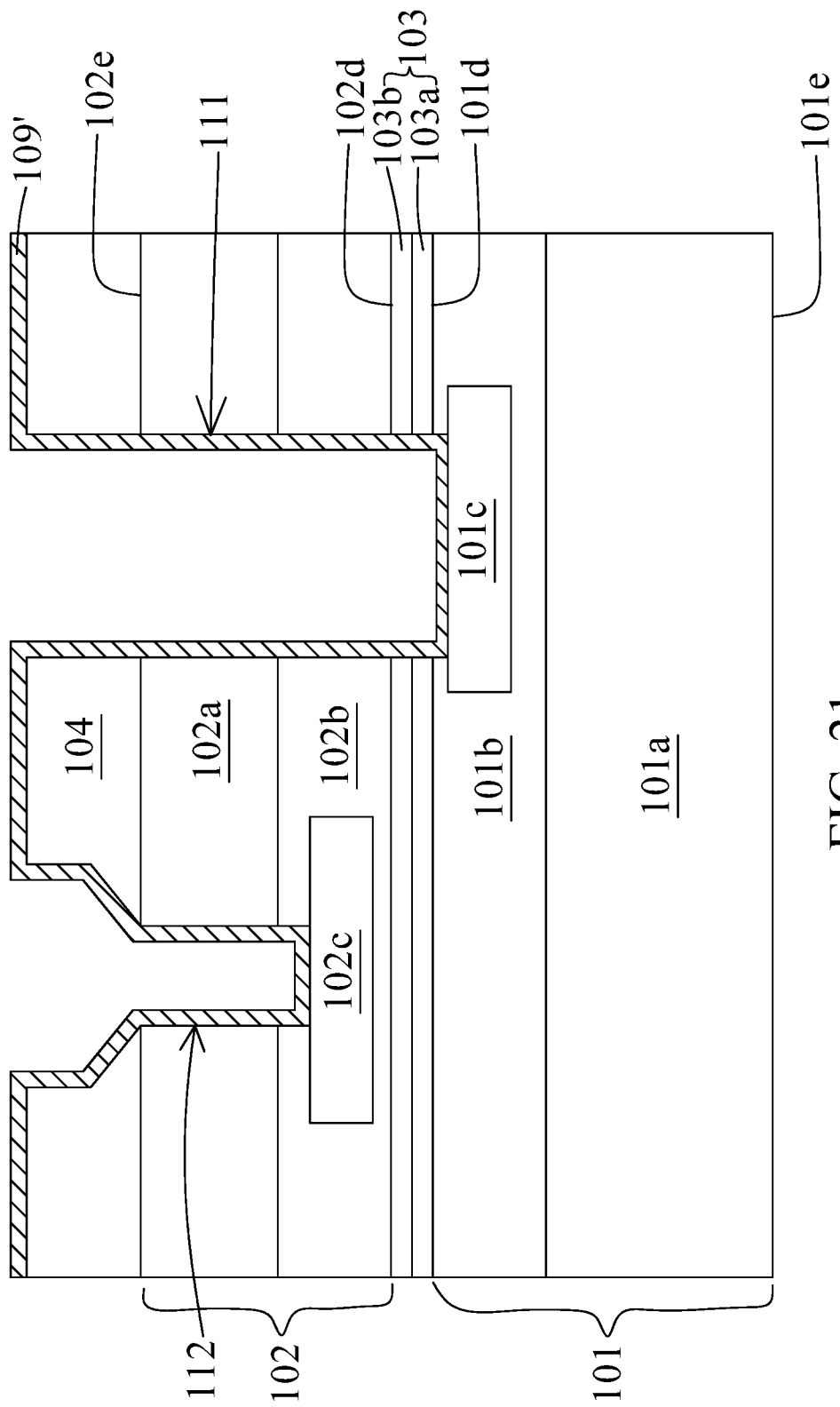
Figure 22:
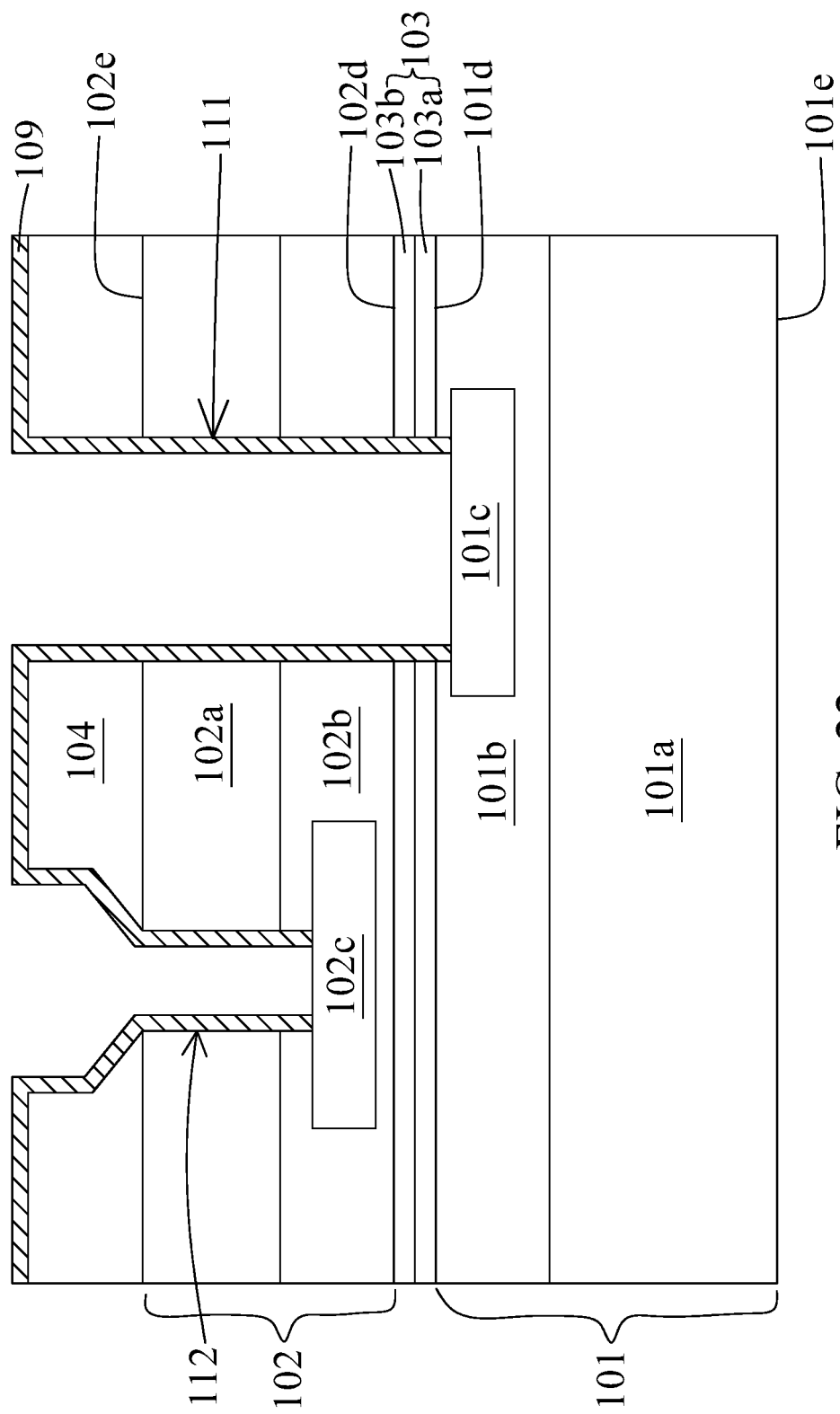

Referring to FIG. 22, a dielectric liner 109 is disposed over the passivation 104 and conformal to the first trench 111 and the second trench 112 according to step S212 in FIG. 2C. In some embodiments, the disposing of the dielectric liner 109 includes disposing a dielectric material 109' as shown in FIG. 21, and removing a portion of the dielectric material 109' to form the dielectric liner 109 as shown in FIG. 22. In some embodiments, the dielectric material 109' is disposed over the passivation 104, the first conductive pad 101c exposed through the first trench 111 and the second conductive pad 102c exposed through the second trench 112. In some embodiments, the dielectric material 109' is disposed conformal to the first trench 111 and the second trench 112. In some embodiments, the dielectric material 109' is disposed by deposition, atomic layer deposition (ALD), CVD or another suitable process. In some embodiments, the dielectric material 109' includes dielectric material such as oxide or the like.

In some embodiments, portions of the dielectric material 109' on the first conductive pad 101c and the second conductive pad 102c are removed by etching or any other suitable process. In some embodiments, the first conductive pad 101c and the second conductive pad 102c are at least partially exposed through the dielectric liner 109. In some embodiments, the dielectric liner 109 has a configuration similar to that described above or illustrated in FIG. 1.

Figure 23:
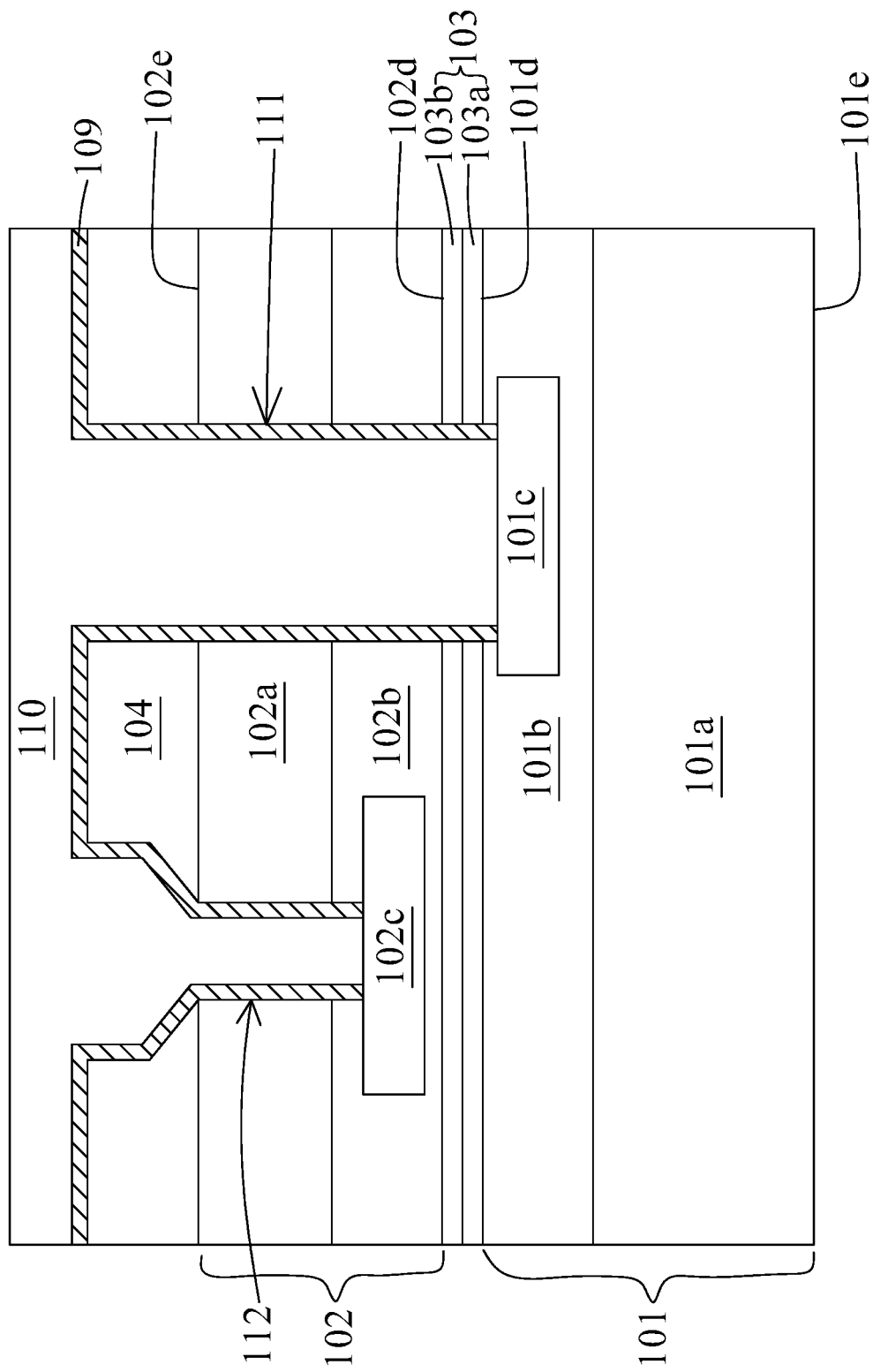
Figure 24:
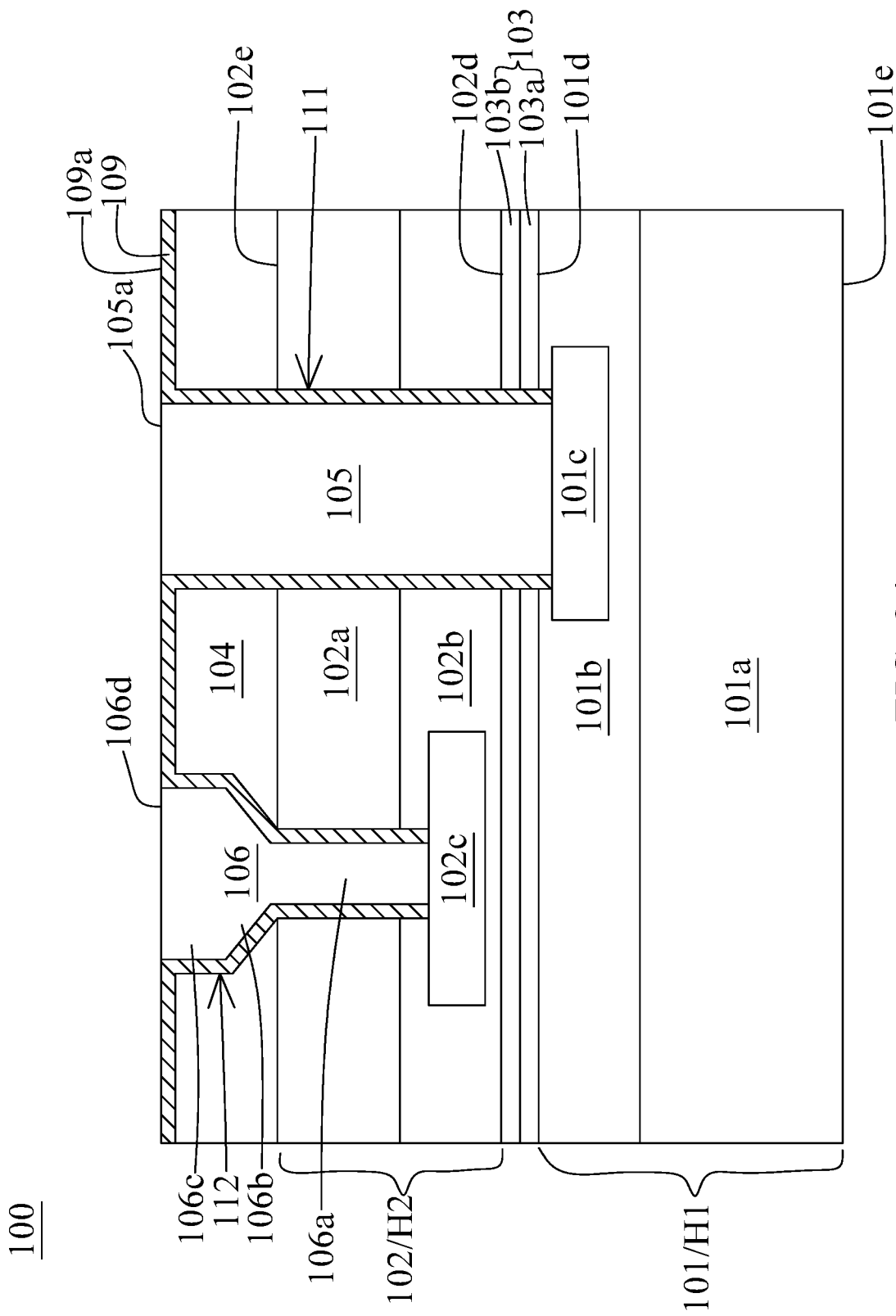

Referring to FIG. 24, a first conductive via 105 within the first trench 111 and a second conductive via 106 within the second trench 112 are formed according to step S213 in FIG. 2C. In some embodiments, the formation of the first conductive via 105 and the second conductive via 106 includes disposing a conductive material 110 within the first trench 111 and the second trench 112 as shown in FIG. 23, and planarizing the conductive material 110 to form the first conductive via 105 and the second conductive via 106 as shown in FIG. 24.

In some embodiments, prior to the disposing of the conductive material 110, a diffusion barrier layer is disposed over the dielectric liner 109 and conformal to the first trench 111 and the second trench 112. In some embodiments, the diffusion barrier layer is disposed by ALD, CVD or the like. In some embodiments, the diffusion barrier layer includes titanium, titanium nitride, tantalum, tantalum nitride, nickel or the like.

In some embodiments, after the disposing of the diffusion barrier layer, a seed layer is disposed over the diffusion barrier layer. In some embodiments, the seed layer is disposed by sputtering or another suitable operation. In some embodiments, the seed layer includes titanium, copper, nickel, gold or the like.

In some embodiments, the conductive material 110 is disposed over the dielectric liner 109 and conformal to the first trench 111 and the second trench 112. In some embodiments, the conductive material 110 is in contact with the dielectric liner 109, the second conductive pad 102c, the bonding dielectric 103 and the first conductive pad 101c. In some embodiments, the conductive material 110 is disposed by electroplating or another suitable operation. In some embodiments, the conductive material 110 includes gold, silver, copper, nickel, tungsten, aluminum, tin, alloys thereof or the like.

In some embodiments, after the disposing of the conductive material 110, a portion of the conductive material 110 is removed to form the first conductive via 105 and the second conductive via 106 as shown in FIG. 24. In some embodiments, the portion of the conductive material 110 is removed by grinding, etching, CMP or another suitable operation. In some embodiments, a top surface 105a of the first conductive via 105, a top surface 106d of the second conductive via 106 and a top surface 109a of the dielectric liner 109 are substantially coplanar after the removal of the portion of the conductive material 110.

In some embodiments, the first conductive via 105 has a configuration similar to that of the first conductive via 105 described above or illustrated in FIG. 1. In some embodiments, the second conductive via 106 has a configuration similar to that of the second conductive via 106 described above or illustrated in FIG. 1. In some embodiments, the semiconductor structure 100 as shown in FIG. 1 is formed as shown in FIG. 24.

In conclusion, because a mask having different transmission rates in different regions is used during a lithography process, a semiconductor structure having at least two vias of different sizes can be formed. Since at least two vias of different sizes can be formed using one mask, manufacturing cost and materials can be reduced or minimized.

One aspect of the present disclosure provides a semiconductor structure. The semiconductor structure includes a first wafer including a first substrate, a first dielectric layer over the first substrate, and a first conductive pad surrounded by the first dielectric layer; a second wafer including a second dielectric layer, a second substrate over the second dielectric layer, and a second conductive pad surrounded by the second dielectric layer; a passivation disposed over the second substrate; a first conductive via extending from the first conductive pad through the second wafer and the passivation, and having a first width surrounded by the second wafer; and a second conductive via extending from the second conductive pad through the passivation and the second substrate and partially through the second dielectric layer, and having a second width surrounded by the second wafer, wherein the second width is substantially less than the first width.

Another aspect of the present disclosure provides a semiconductor structure. The semiconductor structure includes a first wafer; a second wafer disposed over the first wafer; a passivation disposed over the second wafer; a first conductive via extending through the second wafer and the passivation and partially through the first wafer, and having a first width surrounded by the second wafer and the passivation; and a second conductive via extending through the passivation and partially through the second wafer, and having a second width surrounded by the second wafer and a third width surrounded by the passivation, wherein the first width is substantially equal to the third width and is substantially greater than the second width.

Another aspect of the present disclosure provides a method of manufacturing a semiconductor structure. The method includes steps of providing a first wafer including a first substrate, a first dielectric layer over the first substrate, and a first conductive pad surrounded by the first dielectric layer; providing a second wafer including a second substrate, a second dielectric layer over the second substrate, and a second conductive pad surrounded by the second dielectric layer; bonding the first dielectric layer to the second dielectric layer; disposing a passivation over the second wafer; forming a patterned photoresist layer over the passivation, wherein the patterned photoresist layer includes a first through hole and a first indentation; removing a first portion of the passivation exposed through the first through hole to form a first opening, and a second portion of the passivation under the first indentation to form a first recess; removing a third portion of the second substrate exposed through the first opening to form a second recess; removing a fourth portion of the passivation under the first recess to form a second opening; removing a fifth portion of the second substrate under the second recess to form a third opening, and a sixth portion of the second substrate exposed through the second opening to form a fourth opening; removing a seventh portion of the second dielectric layer exposed through the third opening to at least partially expose the second conductive pad, and an eighth portion of the second dielectric layer and a ninth portion of the first dielectric layer exposed through the fourth opening to at least partially expose the first conductive pad, thereby forming a first trench extending through the second wafer and the passivation and partially through the first dielectric layer, and thereby forming a second trench extending through the passivation and the second substrate and partially through the second dielectric layer; removing the patterned photoresist layer; disposing a dielectric liner over the passivation and conformal to the first trench and the second trench; and forming a first conductive via within the first trench and a second conductive via within the second trench.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor structure, comprising:
providing a first wafer including a first substrate, a first dielectric layer over the first substrate, and a first conductive pad surrounded by the first dielectric layer;
providing a second wafer including a second substrate, a second dielectric layer over the second substrate, and a second conductive pad surrounded by the second dielectric layer;
bonding the first dielectric layer to the second dielectric layer;
disposing a passivation over the second wafer;
forming a patterned photoresist layer over the passivation, wherein the patterned photoresist layer includes a first through hole and a first indentation;
removing a first portion of the passivation exposed through the first through hole to form a first opening, and removing a second portion of the passivation under the first indentation to form a first recess;
removing a third portion of the second substrate exposed through the first opening to form a second recess;
removing a fourth portion of the passivation under the first recess to form a second opening;
removing a fifth portion of the second substrate under the second recess to form a third opening, and removing a sixth portion of the second substrate exposed through the second opening to form a fourth opening;
removing a seventh portion of the second dielectric layer exposed through the third opening to at least partially expose the second conductive pad, and removing an eighth portion of the second dielectric layer and a ninth portion of the first dielectric layer exposed through the fourth opening to at least partially expose the first conductive pad, thereby forming a first trench extending through the second wafer and the passivation and partially through the first dielectric layer, and thereby forming a second trench extending through the passivation and the second substrate and partially through the second dielectric layer;
removing the patterned photoresist layer;
disposing a dielectric liner over the passivation and conformal to the first trench and the second trench; and
forming a first conductive via within the first trench and a second conductive via within the second trench.

2. The method of claim 1, wherein the first through hole has a stepped profile and has a step portion protruding inwardly toward the first through hole.

3. The method of claim 1, wherein the first indentation has a first width, and the first through hole has a second width and a third width above the second width is substantially greater than the second width.

4. The method of claim 3, wherein the first width is substantially greater than the second width and is substantially equal to the third width.

5. The method of claim 1, further comprising, prior to the formation of the patterned photoresist layer:
disposing a photoresist layer over the passivation;
disposing a mask over the photoresist layer;
providing a predetermined electromagnetic radiation over the mask;
irradiating the mask with the predetermined electromagnetic radiation.

6. The method of claim 5, wherein the mask includes a second through hole vertically aligned with and corresponding to the first through hole, and a second indentation vertically aligned with and corresponding to the first indentation.

7. The method of claim 6, wherein the second through hole has a central region and a peripheral region surrounding the central region.

8. The method of claim 7, wherein the central region has a first transmission rate equal to an amount of the predetermined electromagnetic radiation allowed to pass through the central region, the peripheral region has a second transmission rate equal to an amount of the predetermined electromagnetic radiation allowed to pass through the peripheral region, and the second indentation has a third transmission rate equal to an amount of the predetermined electromagnetic radiation allowed to pass through the second indentation.

9. The method of claim 8, wherein the first transmission rate is substantially different from the second transmission rate.

10. The method of claim 8, wherein the first transmission rate is substantially different from the third transmission rate.

11. The method of claim 8, wherein the first transmission rate is substantially greater than the second transmission rate.

12. The method of claim 8, wherein the first transmission rate is substantially greater than the third transmission rate.

13. The method of claim 8, wherein the first transmission rate is about 100%, the second transmission rate is about 6%, and the third transmission rate is substantially less than 6%.

14. The method of claim 5, wherein the predetermined electromagnetic radiation is ultraviolet (UV).

15. The method of claim 1, further comprising grinding the second substrate to reduce a thickness of the second substrate after the bonding of the first dielectric layer to the second dielectric layer.

* * * * *